United States Patent
Samejima et al.

(10) Patent No.: US 9,068,082 B2
(45) Date of Patent: Jun. 30, 2015

(54) COLORED CURABLE COMPOSITION AND COLOR FILTER

(71) Applicant: FUJIFILM Corporation, Tokyo (JP)

(72) Inventors: Suguru Samejima, Haibara-gun (JP); Takashi Kawashima, Haibara-gun (JP); Yoshinori Taguchi, Haibara-gun (JP); Yousuke Murakami, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/588,698

(22) Filed: Jan. 2, 2015

(65) Prior Publication Data

US 2015/0108086 A1 Apr. 23, 2015

Related U.S. Application Data

(63) Continuation of application No. PCT/JP2013/069149, filed on Jul. 12, 2013.

(30) Foreign Application Priority Data

Jul. 30, 2012 (JP) .................. 2012-168439
Jul. 8, 2013 (JP) .................. 2013-142528

(51) Int. Cl.

| | |
|---|---|
| G03F 7/004 | (2006.01) |
| G02B 5/20 | (2006.01) |
| H01L 27/14 | (2006.01) |
| C09B 47/18 | (2006.01) |
| C08F 12/32 | (2006.01) |
| C08F 2/44 | (2006.01) |

(Continued)

(52) U.S. Cl.
CPC ............. *C09B 47/18* (2013.01); *C08F 12/32* (2013.01); *C08F 2/44* (2013.01); *C08L 101/00* (2013.01); *H01L 27/14* (2013.01); *G02B 5/223* (2013.01); *H01L 27/322* (2013.01); *H01L 27/14621* (2013.01); *G02F 1/133514* (2013.01); *G03F 7/0007* (2013.01); *G03F 7/105* (2013.01); *C08K 5/0041* (2013.01); *C08K 5/0091* (2013.01); *C09B 11/24* (2013.01); *C09B 23/06* (2013.01); *C09B 23/083* (2013.01); *C09B 29/0808* (2013.01); *C09B 29/081* (2013.01); *C09B 29/366* (2013.01); *C09B 47/10* (2013.01); *G03F 7/004* (2013.01)

(58) Field of Classification Search
CPC ....... G03F 7/0007; G03F 7/004; G02B 5/223; C09B 47/18
USPC ............ 430/7, 281.1; 540/130, 131, 136, 137
See application file for complete search history.

(56) References Cited

U.S. PATENT DOCUMENTS

| 5,578,419 A | 11/1996 | Itoh |
|---|---|---|
| 2009/0047585 A1 * | 2/2009 | Seto et al. .................. 430/7 |

(Continued)

FOREIGN PATENT DOCUMENTS

| JP | 5-271567 A | 10/1993 |
|---|---|---|
| JP | 2002069109 A | 3/2002 |
| JP | 2004161926 A | 6/2004 |
| JP | 2006342264 A | 12/2006 |
| JP | 2010-102343 A | 5/2010 |
| KR | 10-2013-0078759 A | 7/2013 |

OTHER PUBLICATIONS

International Preliminary Report on Patentability and Written Opinion, issued Feb. 3, 2015 PCT/JP2013/069149, 12 pages in English and Japanese.

(Continued)

*Primary Examiner* — John A McPherson
(74) *Attorney, Agent, or Firm* — Sughrue Mion, PLLC

(57) ABSTRACT

A colored curable composition of the present invention contains a compound represented by general formula (1). In general formula (1), $X^1$ to $X^4$ each represents a halogen atom, and M represents a metal atom, a metal oxide, a metal halide or a non-metal. $R^1$ to $R^4$ each represents a group represented by general formula (2) or a substituent other than the group, and at least one of $R^1$ to $R^4$ is a group represented by general formula (2). $n^1$ to $n^4$ each represents an integer of 0 to 4, and $m^1$ to $m^4$ represent an integer of 0 to 4. However, the sum total of $n^1$ to $n^4$ and the sum total of $m^1$ to $m^4$ are each 1 or higher. In general formula (2), $L^1$ represents a divalent linking group, Ar represents an arylene group and A represents a group having a polymerizable group.

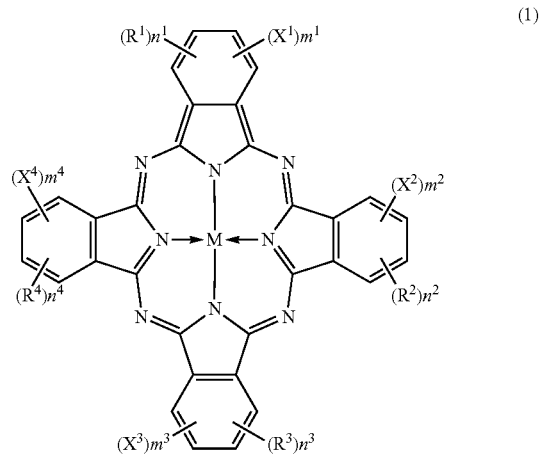

18 Claims, No Drawings

(51) Int. Cl.
    *C08L 101/00*     (2006.01)
    *G02B 5/22*     (2006.01)
    *H01L 27/146*     (2006.01)
    *G03F 7/00*     (2006.01)
    *G03F 7/105*     (2006.01)
    *C08K 5/00*     (2006.01)
    *C09B 11/24*     (2006.01)
    *C09B 23/06*     (2006.01)
    *C09B 23/08*     (2006.01)
    *C09B 29/08*     (2006.01)
    *C09B 29/50*     (2006.01)
    *C09B 47/10*     (2006.01)
    *H01L 27/32*     (2006.01)
    *G02F 1/1335*     (2006.01)

(56) References Cited

U.S. PATENT DOCUMENTS

2010/0104958 A1     4/2010   Jeong et al.
2011/0228201 A1*   9/2011   Hsu et al. ............... 349/106
2012/0242940 A1*   9/2012   Nagata et al. ........... 349/106

OTHER PUBLICATIONS

International Search Report for PCT/JP/069149 dated Oct. 15, 2013, 3 pages.

Written Opinion for PCT/JP/069149 dated Oct. 15, 2013, 5 pages.

* cited by examiner

COLORED CURABLE COMPOSITION AND COLOR FILTER

CROSS-REFERENCE TO RELATED APPLICATIONS

This application is a Continuation of PCT International Application No. PCT/JP2013/069149 filed on Jul. 12, 2013, which claims priority under 35 U.S.C §119(a) to Japanese Patent Application No. 2012-168439 filed on Jul. 30, 2012 and Japanese Patent Application No. 2013-142528 filed on Jul. 8, 2013. Each of the above application(s) is hereby expressly incorporated by reference, in its entirety, into the present application.

BACKGROUND OF THE INVENTION

1. Field of the Invention

The present invention relates to a colored curable composition and a color filter in which the colored curable composition is used. The present invention further relates to a solid-state imaging element in which the color filter is used. In addition, the present invention relates to a manufacturing method of the color filter.

2. Description of the Related Art

In the related art, a colored curable composition is prepared by containing a pigment dispersion composition in which an organic or inorganic pigment is dispersed, a multifunctional monomer, a polymerization initiator, an alkali soluble resin, and other components as needed, and a color filter is manufactured by forming a color pattern with a photolithography method, ink jet method or the like using this composition.

In recent years, for color filters, there is a tendency for the usage of liquid crystal display elements (LCD) to expand not only to monitors but also to televisions (TV). Accompanying this tendency towards expansion in usage, there continues to be demand in color filters for high color properties, such as chromaticity, contrast and the like. In addition, even in a color filter used in an image sensor (solid-state imaging element), there is similar demand for further improvements in color properties, such as reductions in color variations, and improvements in chromatic resolving power.

However, in a pigment dispersion system of the related art, problems such as scattering generated due to coarse particles of the pigment and increasing viscosity due to dispersion stability defects easily occur, and there are numerous difficulties in further improving the contrast and brightness.

Here, using a dye, other than a pigment, as the colorant from the related art is being investigated. When a dye is used as a colorant, the hue or color purity of a displayed image can be increased when an image is displayed due to the brightness or clarity of hue of the dye itself, and it is useful on the point of improvements in contrast since coarse particles are eliminated.

Examples of the dye include the phthalocyanine compounds disclosed in JP1993-271567A (JP-H05-271567A) and JP2010-102343A.

SUMMARY OF THE INVENTION

However, the present inventors found through research that the phthalocyanine compounds disclosed in JP1993-271567A (JP-H05-271567A) and JP2010-102343A have problems of low solubility to a solvent and precipitation of the phthalocyanine compounds when a color filter is manufactured. In addition, it is desired that the colored curable composition used in a color filter or the like is difficult to absorb unnecessary wavelengths of light (transmissivity with respect to unnecessary wavelengths of light is high) as a color filter; however, for colored curable compositions containing the phthalocyanine compounds disclosed in JP1993-271567A (JP-H05-271567A) and JP2010-102343A, this is insufficient. An object of the present invention is to resolve these problems, and to provide a colored curable composition with high solubility in a solvent which is difficult to absorb unnecessary wavelengths of light as a color filter.

As a result of thorough research performed by the present inventors based on this situation, it was discovered that by introducing a group including a halogen atom and a polymerizable group having an arylene group to the phthalocyanine compound, a colored curable composition is obtained in which desired spectral characteristics can be attained, unnecessary wavelengths of light are difficult to absorb (transmissivity with respect to unnecessary wavelengths of light is high) as a color filter, and with high solubility in a solvent, and the present invention was completed.

Specifically, the present invention solves the problem through means <1>, and preferably, <2> to <16> below.

<1> A colored curable composition containing a compound represented by general formula (1) below.

[Chem. 1]

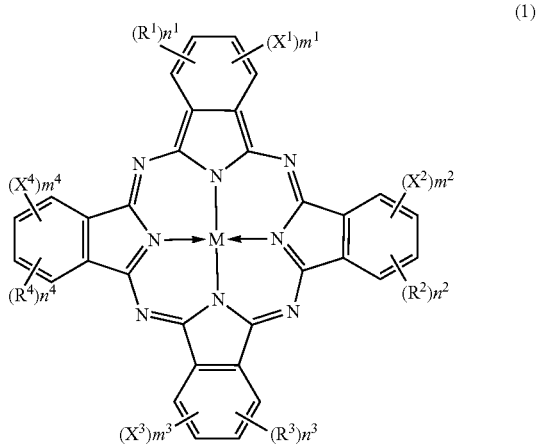

(In general formula (1), $X^1$ to $X^4$ each represents a halogen atom, and M represents a metal atom, a metal oxide, a metal halide or a non-metal. $R^1$ to $R^4$ each represents a group represented by general formula (2) below or a substituent other than the group, and at least one of $R^1$ to $R^4$ is a group represented by general formula (2) below. $n^1$ to $n^4$ represent an integer of 0 to 4, and $m^1$ to $m^4$ represent an integer of 0 to 4. However, the sum total of $n^1$ to $n^4$ and the sum total of $m^1$ to $m^4$ are each 1 or higher.)

[Chem. 2]

$$*\text{-}L^1\text{-}Ar\text{-}A \quad (2)$$

(In general formula (2), $L^1$ represents a divalent linking group, Ar represents an arylene group, and A represents a group represented by general formula (3) below. * represents a site bonding with a phthalocyanine ring.)

[Chem. 3]

(In general formula (3), $L^2$ represents a single bond or a divalent linking group. $R^5$ to $R^7$ each represents a hydrogen atom or a monovalent substituent. * represents a site bonding with Ar in general formula (2).)

<2> The colored curable composition according to <1>, where $X^1$ to $X^4$ in the general formula (1) are each a chlorine atom or a fluorine atom.

<3> The colored curable composition according to <1> or <2>, where Ar in the general formula (2) is a phenylene group or a naphthylene group.

<4> The colored curable composition according to any one of <1> to <3>, where $L^1$ in the general formula (2) is —O— or —S—.

<5> The colored curable composition according to any one of <1> to <4>, where $X^1$ to $X^4$ in the general formula (1) is a chlorine atom; Ar in the general formula (2) is a phenylene group; and $L^1$ is —O—.

<6> The colored curable composition according to any one of <1> to <5>, where the compound represented by the general formula (1) have 1 to 4 of the groups represented by general formula (2) in one molecule.

<7> The colored curable composition according to any one of <1> to <6>, where the compound represented by the general formula (1) has a maximum absorption wavelength of 600 to 750 nm.

<8> The colored curable composition according to any one of <1> to <7>, further containing a curable compound.

<9> The colored curable composition according to any one of <1> to <8>, further containing a yellow colorant.

<10> The colored curable composition according to <9>, where the yellow colorant is an azo-based dye or a monomethine-based dye.

<11> The colored curable composition according to <10>, where the yellow colorant is a monomethine-based dye represented by general formula (4) below.

[Chem. 4]

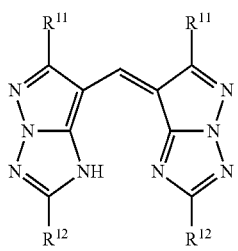

(4)

(In general formula (4), $R^{11}$ each represents an alkyl group or a vinyl group, and $R^{12}$ each represents a substituent.)

<12> A color filter having a colored layer formed by using the colored curable composition according to any one of <1> to <11>.

<13> A manufacturing method of a color filter including: forming a colored layer by applying the colored curable composition according to any one of <1> to <11> on a substrate; further forming a photoresist layer on the formed colored layer; forming a resist pattern by exposing and developing the photoresist layer to a pattern shape; and forming a colored region by dry etching the colored layer with the resist pattern as an etching mask.

<14> A manufacturing method of a color filter comprising: forming a colored layer by applying the colored curable composition according to any one of <1> to <11> on a substrate; and forming a colored region by exposing and developing the formed colored layer to a pattern shape.

<15> A solid-state imaging element, liquid crystal display device or organic EL display device having a color filter according to <12> or a color filter prepared by the manufacturing method according to <13> or <14>.

<16> A dye represented by general formula (1) below.

[Chem. 5]

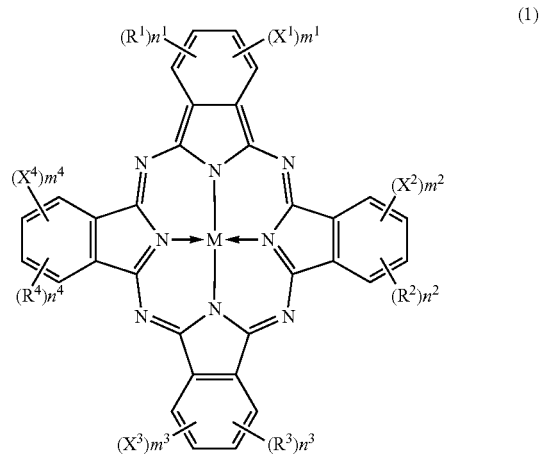

(1)

(In general formula (1), $X^1$ to $X^4$ each represents a halogen atom, and M represents a metal atom, a metal oxide, a metal halide or a non-metal. $R^1$ to $R^4$ each represents a group represented by general formula (2) below or a substituent other than the group, and at least one of $R^1$ to $R^4$ is a group represented by general formula (2) below. $n^1$ to $n^4$ represent an integer of 0 to 4, and $m^1$ to $m^4$ represent an integer of 0 to 4. However, the sum total of $n^1$ to $n^4$, and the sum total of $m^1$ to $m^4$ are 1 or higher, respectively.)

[Chem. 6]

*-$L^1$-Ar-A (2)

(In general formula (2), $L^1$ represents a divalent linking group, Ar represents an arylene group, and A represents a group represented by general formula (3) below. * represents a site bonding with a phthalocyanine ring.)

[Chem. 7]

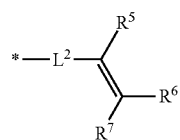

(3)

(In general formula (3), $L^2$ represents a single bond or a divalent linking group. $R^5$ to $R^7$ each represents a hydrogen atom or a monovalent substituent. * represents a site bonding with Ar in general formula (2).)

According to the present invention, it is possible to provide a colored curable composition which is difficult to absorb unnecessary wavelengths of light (transmissivity is high) as a color filter, and with high solubility in a solvent.

DESCRIPTION OF THE PREFERRED EMBODIMENTS

Below, the content of the present invention will be described in detail. Moreover, the term "to" is used in the present specification with the meaning of including the numerical values before and after "to" as the lower limit value and the upper limit value. Moreover, in the description of a group (atomic group) in the present specification, when the description does not specify substituted or unsubstituted, the group includes both a group (atomic group) having no substituent and a group (atomic group) having a substituent. For example, the term "alkyl group" includes not only an alkyl group not having a substituent (unsubstituted alkyl group) but also an alkyl group having a substituent (substituted alkyl group).

Moreover, in the present specification, "(meth)acrylate" represents both acrylate and methacrylate, "(meth)acryl" represents both acryl and methacryl, and "(meth)acryloyl" represents both acryloyl and methacryloyl. In addition, the terms "monomer" and "monomer" in the present specification have the same meaning. The monomer in the present specification is distinguished from an oligomer and a polymer, and refers to a compound with a weight average molecular weight of 2000 or less. In the present specification, a polymerizable compound is a compound which has a polymerizable functional group, and may be a monomer or a polymer. A polymerizable functional group is a group which is involved in a polymerization reaction.

The colored curable composition of the present invention contains a compound represented by general formula (1) below.

[Chem. 8]

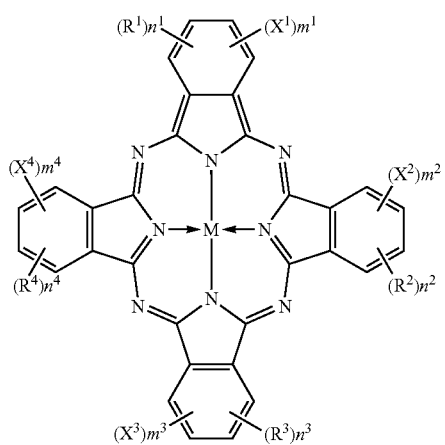

(1)

(In general formula (1), $X^1$ to $X^4$ each represents a halogen atom, and M represents a metal atom, a metal oxide, a metal halide or a non-metal. $R^1$ to $R^4$ each represents a group represented by general formula (2) below or a substituent other than the group, and at least one of $R^1$ to $R^4$ is a group represented by general formula (2) below. $n^1$ to $n^4$ each represents an integer of 0 to 4, and $m^1$ to $m^4$ represent an integer of 0 to 4. However, the sum total of $n^1$ to $n^4$, and the sum total of $m^1$ to $m^4$ are each 1 or higher.)

General Formula (2)

[Chem. 9]

(2)

(In general formula (2), $L^1$ represents a divalent linking group, Ar represents an arylene group, and A represents a group represented by general formula (3) below. * represents a site bonding with a phthalocyanine ring.)

General Formula (3)

[Chem. 10]

$$*-L^2-\underset{R^7}{\overset{R_5}{{=}}}R^6$$ (3)

(In general formula (3), $L^2$ represents a single bond or a divalent linking group. $R^5$ to $R^7$ each represents a hydrogen atom or a monovalent substituent. * represents a site bonding with Ar in general formula (2).)

$X^1$ to $X^4$ each represents a halogen atom. The spectral characteristics can be improved by employing a halogen atom. In particular, the effects thereof are remarkable in the present invention in which the phthalocyanine compound has an arylene group. $X^1$ to $X^4$ is preferably a fluorine atom, a chlorine atom, a bromine atom or an iodine atom, and from the viewpoints of further improvements in solubility and in transmissivity more preferably a fluorine atom or a chlorine atom. The positions of $X^1$ to $X^4$ are not particularly limited; however, at least, being positioned at the α-position of the phthalocyanine skeleton is preferable. When $m^1$ to $m^4$ are each 2 or higher, 2 or more of $X^1$ to $X^4$ may be the same as each other, or may be different, and are preferably the same.

M represents a metal atom, a metallic oxide, a metallic halide or a non-metal, preferably a metal atom, metal oxide or metal halide, and more preferably a metal atom. The metal atom is preferably Cu, Zn, Pb, Fe, Ni or Co, and more preferably Cu or Zn. The metal oxide is preferably Ti(=O) or V(=O). The metal halide is preferably AlCl, AlI, InCl, InI, GaCl, GaI, TiCl$_2$, VCl$_2$, SnCl$_2$, SiCl$_2$ or GeCl$_2$. The non-metal refers to a case where M is two hydrogen atoms (metal free compound); specifically, in a case where M represents a non-metal, formula (1) is represented as below.

[Chem. 11]

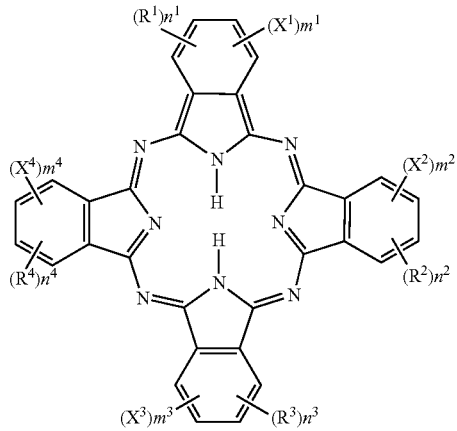

$R^1$ to $R^4$ each represents a group represented by general formula (2) or a substituent other than the group, and at least one of $R^1$ to $R^4$ in one molecule is a group represented by general formula (2). It is preferable that 1 to 8 of $R^1$ to $R^4$ in one molecule be a group represented by general formula (2), more preferable that 1 to 4 of $R^1$ to $R^4$ in one molecule be a group represented by general formula (2) and particularly preferable that 2 to 4 of $R^1$ to $R^4$ in one molecule be a group represented by general formula (2). In a case where $R^1$ to $R^4$ are groups represented by general formula (2), the group is preferably positioned at the β-position of the phthalocyanine skeleton.

In a case where $R^1$ to $R^4$ is a substituent other than a group represented by general formula (2), examples of the substituent include the substituent T described later, and is preferably an aryloxy group, an arylthio group, a heterocyclic oxy group, or an arylsulfonyl group. In the present invention, the mass (molecular weight when the general formula (2) portion is considered one molecule) of a portion of the group in one molecule of a substituent other than a group represented by general formula (2) is preferably 100 to 1000.

In a case where $R^1$ to $R^4$ are groups other than groups represented by general formula (2), the group is preferably positioned at the β-position of the phthalocyanine skeleton.

When $n^1$ to $n^4$ above are each 2 or more, 2 or more of $R^1$ to $R^4$ may be the same or may be different, and are preferably the same.

$n^1$ to $n^4$ each represents an integer of 0 to 4, and are preferably an integer of 0 to 2, and more preferably 0 or 1. However, the sum total of $n^1$ to $n^4$ in one molecule is 1 or more, is preferably an integer of 2 to 8, and more preferably an integer of 2 to 4.

$m^1$ to $m^4$ each represents an integer of 0 to 4. However, the sum total of $m^1$ to $m^4$ is 1 or more, is preferably an integer of 6 to 14, and more preferably an integer of 9 to 14.

Examples of the above-described substituent T include, an alkyl group (in a linear, branched or cyclic alkyl group, preferably having 1 to 48 carbon atoms, more preferably having 1 to 24 carbon atoms, for example, a methyl group, an ethyl group, a propyl group, an isopropyl group, a butyl group, a t-butyl group, a pentyl group, a hexyl group, a heptyl group, an octyl group, a 2-ethylhexyl group, a dodecyl group, a hexadecyl group, a cyclopropyl group, a cyclopentyl group, a cyclohexyl group, a 1-norbornyl group, or a 1-adamantyl), an alkenyl group (in an alkenyl group, preferably having 2 to 48 carbon atoms and more preferably having 2 to 18 carbon atoms, for example, a vinyl group, an allyl group, 3-butene-1-yl group), an alkynyl group (preferably having 2 to 20 carbon atoms, and more preferably 2 to 12 carbon atoms, and particularly preferably 2 to 8 carbon atoms, examples include a propargyl group, a 3-pentynyl group, or the like), aryl group (in an aryl group preferably having number 6 to 48 carbon atoms, and more preferably having 6 to 24 carbon atoms, for example, a phenyl group, or a naphthyl group), a heterocyclic group (in a heterocyclic group preferably having 1 to 32 carbon atoms, and more preferably having 1 to 18 carbon atoms, for example, a 2-thienyl group, a 4-pyridyl group, a 2-furyl group, a 2-pyrimidinyl group, a 1-pyridyl group, a 2-benzothiazolyl group, a 1-imidazolyl group, a 1-pyrazolyl group, or a benzotriazol-1-yl group), a silyl group (in a silyl group preferably having 3 to 38 carbon atoms and more preferably having 3 to 18 carbon atoms, for example, a trimethylsilyl group, a triethylsilyl group, a tributylsilyl group, a t-butyldimethylsilyl group, or a t-hexyldimethyl silyl group), a hydroxyl group, a cyano group, a nitro group, an alkoxy group (in an alkoxy group preferably having 1 to 48 carbon atoms, and more preferably having 1 to 24 carbon atoms, for example, in a methoxy group, an ethoxy group, a 1-butoxy group, a 2-butoxy group, an isopropoxy group, a t-butoxy group, a dodecyl group, or a cycloalkyloxy group, for example, a cyclopentyloxy group, or a cyclohexyloxy group), an aryloxy group (in an aryloxy group preferably having 6 to 48 carbon atoms, and more preferably having 6 to 24 carbon atoms, for example, a phenoxy group, a 1-naphthoxy group), a heterocyclic oxy group (in a heterocyclic oxy group preferably having 1 to 32 carbon atoms, and more preferably having 1 to 18 carbon atoms, for example, a 1-phenyltetrazole-5-oxy group or a 2-tetrahydropyranyloxy group), a silyloxy group (in a silyloxy group preferably having 1 to 32 carbon atoms, and more preferably having 1 to 18 carbon atoms, for example, a trimethylsilyloxy group, a t-butyldimethylsilyloxy group, or a diphenylmethylsilyloxy group), an acyloxy group (in an acyloxy group preferably having 2 to 48 carbon atoms, and more preferably having 2 to 24 carbon atoms, for example, an acetoxy group, a pivaloyloxy group, a benzoyloxy group, or a dodecanoyloxy group), an alkoxycarbonyloxy group (in an alkoxycarbonyloxy group preferably having 2 to 48 carbon atoms, and more preferably having 2 to 24 carbon atoms, for example, an ethoxycarbonyloxy group, a t-butoxycarbonyloxy group, or in a cycloalkyloxycarbonyloxy group, for example, a cyclohexyloxycarbonyloxy group), an aryloxycarbonyloxy group (in an aryloxycarbonyloxy group preferably having 7 to 32 carbon atoms and more preferably 7 to 24 carbon atoms, for example, a phenoxycarbonyloxy group), a carbamoyloxy group (in carbamoyloxy group preferably having 1 to 48 carbon atoms, and more preferably having 1 to 24 carbon atoms, for example, an N,N-dimethylcarbamoyloxy group, an N-butylcarbamoyloxy group, an N-phenylcarbamoyloxy group, an N-ethyl-N-phenylcarbamoyloxy group), a sulfamoyloxy group (in sulfamoyloxy group preferably having 1 to 32 carbon atoms, and more preferably having 1 to 24 carbon atoms, for example, an N,N-diethylsulfamoyloxy group, an N-propyl sulfamoyloxy group), alkylsulfonyloxy group (in alkylsulfonyloxy group preferably having 1 to 38 carbon atoms, and more preferably having 1 to 24 carbon atoms, for example, a methylsulfonyloxy group, a hexadecylsulfonyloxy group, a cyclohexylsulfonyloxy group), an arylsulfonyloxy group (in an arylsulfonyloxy group preferably having 6 to 32 carbon atoms, and more preferably having 6 to 24 carbon atoms, for example, a phenylsulfonyloxy group), acyl group (in an acyl group preferably having 1 to 48 carbon atoms, and more preferably having 1 to 24 carbon atoms, for example, a formyl group, an acetyl group, a pivaloyl group, a benzoyl group, a tetradecanoyl group, or a cyclohexanoyl group), an alkoxycarbonyl group (in an alkoxycarbonyl group preferably having 2 to 48 carbon atoms, and more preferably having 2 to 24 carbon atoms, for example, a methoxycarbonyl group, an ethoxycarbonyl group, an octadecyloxycarbonyl group, a cyclohexyloxycarbonyl group, a 2,6-di-tert-butyl-4-methylcyclohexyloxycarbonyl group), an aryloxycarbonyl group (in an aryloxycarbonyl group preferably having 7 to 32 carbon atoms, and more preferably having 7 to 24 carbon atoms, for example, a phenoxycarbonyl group), a carbamoyl group (carbamoyl group preferably having 1 to 48 carbon atoms, and more preferably having 1 to 24 carbon atoms, for example, a carbamoyl group, an N,N-diethylcarbamoyl group, an N-ethyl-N-octylcarbamoyl group, an N,N-dibutyl carbamoyl group, an N-propylcarbamoyl group, an N-phenylcarbamoyl group, an N-methyl-N-phenylcarbamoyl group, or an N,N-dicyclohexylcarbamoyl group), an amino group (in an amino group preferably having 32 or fewer carbon atoms, and more preferably having 24 or fewer carbon atoms, for example, an amino group, a methylamino group, an N,N-dibutylamino group, tetradecylamino group, 2-ethylhexylamino group, or a cyclohexyl amino group), an anilino group (in anilino group preferably having 6 to 32 carbon atoms, and more preferably having 6 to 24 carbon atoms, for example, an anilino group, or an N-methylanilino group), heterocyclic amino group (in a heterocyclic amino group preferably having 1 to 32 carbon atoms, and more preferably having 1 to 18 carbon atoms, for example, a 4-pyridylamino group), a carbonamide group (in a carbonamide group preferably having 2 to 48 carbon atoms, and more preferably having 2 to 24 carbon atoms, for example, an acetamide group, a benzamide group, a tetradecaneamide group, a pivaloylamide group, a cyclohexaneamide group), a ureido group (in a ureido group preferably having 1 to 32 carbon atoms, and more preferably having 1 to 24 carbon atoms, for example, a ureido group, an N,N-dimethyl ureido group, or an N-phenylureido group), imide group (in an imide group preferably having 36 or fewer carbon atoms, and more preferably having 24 or fewer carbon atoms, for example, an N-succinimide group, or an N-phthalimide group), alkoxycarbonylamino group (in alkoxycarbonylamino group preferably having 2 to 48 carbon atoms, and more preferably having 2 to 24 carbon atoms, for example, a methoxycarbonyl amino group, an ethoxycarbonylamino group, a t-butoxycarbonylamino group, an octadecyloxycarbonylamino group, or a cyclohexyloxycarbonylamino group), an aryloxycarbonylamino group (in an aryloxycarbonylamino group preferably having 7 to 32 carbon atoms, and more preferably having 7 to 24 carbon atoms, for example, a phenoxycarbonylamino group), a sulfonamide group (in a sulfonamide group preferably having 1 to 48 carbon atoms, and more preferably having 1 to 24 carbon atoms, for example, a methanesulfonamide group, a butanesulfonamide group, a benzenesulfonamide group, a hexadecanesulfonamide group, or a cyclohexanesulfonamide group), a sulfamoylamino group (in sulfamoylamino group preferably having 1 to 48 carbon atoms, and more preferably having 1 to 24 carbon atoms, for example, an N,N-dipropylsulfamoylamino group, N-ethyl-N-dodecylsulfamoyl amino group), an azo group (in an azo group preferably having 1 to 32 carbon atoms, and more preferably having 1 to 24 carbon atoms, for example, a phenylazo group, or a 3-pyrazolyl azo group), an alkylthio group (in an alkylthio group preferably having 1 to 48 carbon atoms, and more preferably having 1 to 24 carbon atoms, for example, a methylthio group, an ethylthio group, an octylthio group, or a cyclohexylthio group), an arylthio group (in an arylthio group preferably having 6 to 48 carbon atoms, and more preferably having 6 to 24 carbon atoms, for example, a phenylthio group), a heterocyclic thio group (in a heterocyclic thio group preferably having 1 to 32 carbon atoms, and more preferably having 1 to 18 carbon atoms, for example, a 2-benzothiazolylthio group, a 2-pyridylthio group, or a 1-phenyltetrazolylthio group), an alkylsulfinyl group (in an alkylsulfinyl group preferably having 1 to 32 carbon atoms, and more preferably having 1 to 24 carbon atoms, for example, a dodecanesulfinyl group), an arylsulfinyl group (in an arylsulfinyl group preferably having 6 to 32 carbon atoms, and more preferably having 6 to 24 carbon atoms, for example, a phenylsulfinyl group), an alkylsulfonyl group (in an alkylsulfonyl group preferably having 1 to 48 carbon atoms, and more preferably having 1 to 24 carbon atoms, for example, a methylsulfonyl group, an ethylsulfonyl group, a propylsulfonyl group, a butylsulfonyl group, an isopropylsulfonyl group, a 2-ethylhexylsulfonyl group, a hexadecylsulfonyl group, an octylsulfonyl group, or cyclohexylsulfonyl group), an arylsulfonyl group (in an arylsulfonyl group preferably having 6 to 48 carbon atoms, and more preferably having 6 to 24 carbon atoms, for example, a phenylsulfonyl group, or a 1-naphthylsulfonyl group), a sulfamoyl group (in a sulfamoyl group preferably having 32 or fewer carbon atoms, and more preferably having 24 or fewer carbon atoms, for example, a sulfamoyl group, an N,N-dipropylsulfamoyl group, an N-ethyl-N-dodecylsulfamoyl group, N-ethyl-N-phenylsulfamoyl group, N-cyclohexylsulfamoyl group), a sulfo group, a phosphonyl group (in a phosphonyl group preferably having 1 to 32 carbon atoms, and more preferably having 1 to 24 carbon atoms, for example, a phenoxyphosphonyl group, an octyloxyphosphonyl group, or a phenylphosphonyl group), or a phosphinoylamino group (in a phosphinoylamino group preferably having 1 to 32 carbon atoms, and more preferably having 1 to 24 carbon atoms, for example, a diethoxyphosphinoylamino group, or dioctyloxyphosphinoyl amino group). These substituents may further be substituted. In addition, in a case where there are two or more substituents, the substituents may be the same or different. In addition, in cases where possible, the substituents may be linked together to form a ring.

In general formula (2), $L^1$ represents a divalent linking group. By making the relevant portions a linking group, solubility can be improved. $L^1$ is preferably a divalent linking group preferably formed from 1 or a combination of two or more of —O—, —S—, —C(=O)—, —CH$_2$—, —C(=S)—, —NR$^4$—, —SO—, and —SO$_2$—, more preferably a divalent linking group formed from one or a combination of two or more of —O—, —S—, —C(=O)—, —CH$_2$—, and —SO$_2$—, still more preferably —O— or —S—, and particularly preferably —O—. The $R^4$ represents a hydrogen atom, an alkyl group or an aryl group. The alkyl group is an alkyl group having 1 to 10 carbon atoms (such as, a methyl group, an ethyl group, a hexyl group, or a cyclohexyl group), and the aryl group is an aryl group having 6 to 10 carbon atoms (such as, a phenyl group or a naphthyl group). $R^4$ is preferably a hydrogen atom, a methyl group or an ethyl group, more preferably a hydrogen atom or a methyl group, and still more preferably a hydrogen atom.

In general formula (2), Ar represents an arylene group. Here, the arylene group refers to an aromatic ring group, and does not include a heterocyclic group. By including an arylene group, solubility of the compound can be improved. In particular, the effects thereof are remarkable in the present invention in which the phthalocyanine compound has a halogen atom. Ar is preferably a phenylene group, or a naphthylene group, and from the viewpoints of increasing solubility and increasing transmissivity a phenylene group or a naphthylene group are more preferable, and a phenylene group is still more preferable.

In general formula (2), A is represented by general formula (3) below.

[Chem. 12]

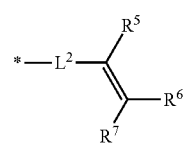

(3)

(In general formula (3), $L^2$ represents a single bond or a divalent linking group. $R^5$ to $R^7$ each represents a hydrogen atom or a monovalent substituent. * represents a site bonding with Ar in general formula (2))

In general formula (3), $L^2$ represents a single bond or a divalent linking group, and a divalent linking group is preferable. The divalent linking group is preferably formed from one or a combination of two or more of —O—, —S—, —C(=O)—, —CH$_2$—, —C(OH)—, —C(=S)—, —NR$^B$, —SO—, or —SO$_2$, and more preferably a divalent linking group formed from one or a combination of two or more of —O—, —C(=O)—, —CH$_2$—, —CH(OH)—, or —NR$^B$.

In general formula (3), an acrylic acid ester structure or a methacrylic acid ester structure is preferably included. For example, in general formula (3), $L^2$ preferably includes C(=O)O— structure on the double bond side.

$R^B$ has the same meaning as $R^A$ above, and the preferable ranges thereof are the same.

In general formula (3), $R^5$ to $R^7$ each represents a hydrogen atom or a monovalent substituent. Examples of the monovalent substituent include the substituent T described above, preferably an alkyl group, and more preferably an alkyl group having 1 to 10 carbon atoms (such as, a methyl group, an ethyl group, a hexyl group or a cyclohexyl group). $R^5$ to $R^7$ are still more preferably a hydrogen atom or a methyl group, $R^6$ and $R^7$ are particularly preferably a hydrogen atom, and $R^5$ is particularly preferably a hydrogen atom or a methyl group.

In particular, it is preferable that the general formula (3) be represented by *-$L^{2A}$-(meth)acryloyloxy group. $L^{2A}$ has the same meaning as the divalent linking group, and more preferably a group formed from one or a combination of two or more of —O—, —C(=O)—, —CH$_2$—, —CH(OH)—, or —NR$^B$—.

Below, preferably embodiments of compounds represented by general formula (1) used in the present invention will be described. It goes without saying that the present invention is not limited to these embodiments.

Embodiment 1

A compound in which $X^1$ to $X^4$ in general formula (1) are a chlorine atom or a fluorine atom, M represents a metal atom, metal oxide, metal halide or non-metal, and Ar in general formula (2) is a phenylene group or a naphthylene group, and L' is represented by —O— or —S—.

Embodiment 2

A compound in which $X^1$ to $X^4$ in general formula (1) are a chlorine atom or a fluorine atom, M represents a metal atom, and Ar in general formula (2) is a phenylene group or a naphthylene group, and $L^1$ is represented by —O— or —S—.

Embodiment 3

A compound in which $X^1$ to $X^4$ in general formula (1) are chlorine atoms, M represents Cu or Zn, and Ar in general formula (2) is a phenylene group, and $L^1$ is represented by —O—.

Embodiment 4

A compound in which $X^1$ to $X^4$ in general formula (1) are chlorine atoms, M represents Cu or Zn, and Ar in general formula (2) is a phenylene group, and $L^1$ is —O—, and has 2 to 4 groups represented by general formula (2) in one molecule.

Embodiment 5

A compound in any of the above embodiments in which $X^1$ to $X^4$ in general formula (1) are positioned at the α-position of a phthalocyanine skeleton, and a group represented by general formula (2) is positioned at the β-position of the phthalocyanine skeleton.

Embodiment 6

A compound in any of the above embodiments having 2 to 4 groups represented by general formula (2) in one molecule.

Embodiment 7

A compound in any of the above embodiments in which any of $R^1$ to $R^4$ is a group represented by general formula (2).

Embodiment 8

A compound in any of the above embodiments in which the total of $m^1$ to $m^4$ is 11 to 14 (preferably 12 or 13).

The compound represented by general formula (1) preferably has a maximum absorption wavelength of 600 to 750 nm, and more preferably a maximum absorption wavelength of 650 to 710 nm. By having a maximum absorption wavelength in the above range, an optimal colored curable composition for a green color filter can be provided.

The molecular weight of the compound represented by general formula (1) is preferably 1500 to 3500, and more preferably 1600 to 2500.

The content in the colored curable composition of the compound represented by general formula (1) differs by molecular weight and absorption coefficient; however, the content is preferably 1 mass % to 70 mass % with respect to the total solid content in the colored curable composition, and more preferably 10 mass % to 50 mass %. By setting the content to 10 mass % or higher, a more satisfactory color density is obtained, and by setting to 50 mass % or lower, there is an advantage on the point of pixel patterning becoming more satisfactory.

In the colored curable composition of the present invention, the content of the phthalocyanine compound other than the compound represented by general formula (1) is preferably 1 mass % or lower of the compound represented by general formula (1), and is more preferably practically not included.

In addition, only one type of compound represented by general formula (1) may be included in the colored curable composition of the present invention, or two or more types may be included. In particular, from the viewpoint of synthesis, isomers are frequently included in the present invention.

Below, examples of the compound represented by general formula (1) are shown; however, it goes without saying that the present invention is not limited thereto. R is preferably bonded to the β-position.

In the table below, the total of a and b falls within the sum total of $n^1$ to $n^4$ in general formula (1).

[Chem. 13]

$$\left[ \text{[macrocyclic structure]} \begin{array}{l} -(R)_a \\ -(R')_b \\ -(X)_c \end{array} \right]$$

TABLE 1

| | R (in General Formula (1), $R^1$ to $R^4$) | R' (in General Formula (1), $R^1$ to $R^4$) | X (in General Formula (1), $X^1$ to $X^4$) | M | a | b | c (in General Formula (1), total sum of $m^1$ to $m^4$) |
|---|---|---|---|---|---|---|---|
| G-1 | R-1 | — | Cl | Zn | 4 | 0 | 12 |
| G-2 | R-1 | — | Cl | Cu | 4 | 0 | 12 |
| G-3 | R-1 | — | F | Zn | 4 | 0 | 12 |
| G-4 | R-1 | — | F | Cu | 4 | 0 | 12 |
| G-5 | R-1 | — | Cl | Zn | 3 | 0 | 13 |
| G-6 | R-1 | — | Cl | Cu | 3 | 0 | 13 |
| G-7 | R-1 | R-1' | Cl | Zn | 2 | 2 | 12 |
| G-8 | R-1 | R-1' | F | Zn | 2 | 2 | 12 |
| G-9 | R-1 | R-1' | Cl | Cu | 2 | 2 | 12 |
| G-10 | R-1 | R-1' | F | Cu | 2 | 2 | 12 |

TABLE 2

| | R | R' | X | M | a | b | c |
|---|---|---|---|---|---|---|---|
| G-11 | R-2 | — | Cl | Zn | 4 | 0 | 12 |
| G-12 | R-2 | R-1' | Cl | Zn | 2 | 2 | 12 |
| G-13 | R-3 | — | Cl | Zn | 4 | 0 | 12 |
| G-14 | R-3 | R-1' | Cl | Zn | 2 | 2 | 12 |
| G-15 | R-4 | — | Cl | Zn | 4 | 0 | 12 |
| G-16 | R-4 | R-2' | Cl | Zn | 2 | 2 | 12 |
| G-17 | R-5 | — | Cl | Zn | 4 | 0 | 12 |
| G-18 | R-6 | — | Cl | Zn | 4 | 0 | 12 |
| G-19 | R-7 | — | Cl | Zn | 4 | 0 | 12 |
| G-20 | R-7 | R-3' | Cl | Zn | 2 | 2 | 12 |

TABLE 3

| | R | R' | X | M | a | b | c |
|---|---|---|---|---|---|---|---|
| G-21 | R-8 | — | Cl | Zn | 4 | 0 | 12 |
| G-22 | R-9 | — | Cl | Zn | 4 | 0 | 12 |
| G-23 | R-10 | — | Cl | Zn | 4 | 0 | 12 |
| G-24 | R-10 | R-4' | Cl | Zn | 2 | 2 | 12 |
| G-25 | R-11 | — | Cl | Zn | 4 | 0 | 12 |
| G-26 | R-12 | — | Cl | Zn | 4 | 0 | 12 |
| G-27 | R-13 | — | Cl | Zn | 4 | 0 | 12 |
| G-28 | R-13 | R-5' | Cl | Zn | 2 | 2 | 12 |
| G-29 | R-14 | — | Cl | Zn | 4 | 0 | 12 |
| G-30 | R-15 | — | Cl | Zn | 4 | 0 | 12 |

TABLE 4

| | R | R' | X | M | a | b | c |
|---|---|---|---|---|---|---|---|
| G-31 | R-16 | — | Cl | Zn | 4 | 0 | 12 |
| G-32 | R-16 | R-6' | Cl | Zn | 2 | 2 | 12 |
| G-33 | R-17 | — | Cl | Zn | 4 | 0 | 12 |
| G-34 | R-18 | — | Cl | Zn | 4 | 0 | 12 |
| G-35 | R-19 | — | Cl | Zn | 4 | 0 | 12 |
| G-36 | R-19 | R-7' | Cl | Zn | 2 | 2 | 12 |
| G-37 | R-20 | — | Cl | Zn | 4 | 0 | 12 |
| G-38 | R-21 | — | Cl | Zn | 4 | 0 | 12 |
| G-39 | R-22 | — | Cl | Zn | 4 | 0 | 12 |
| G-40 | R-22 | R-8' | Cl | Zn | 2 | 2 | 12 |

TABLE 5

| | R | R' | X | M | a | b | c |
|---|---|---|---|---|---|---|---|
| G-41 | R-23 | — | Cl | Zn | 4 | 0 | 12 |
| G-42 | R-24 | — | Cl | Zn | 4 | 0 | 12 |
| G-43 | R-25 | — | Cl | Zn | 4 | 0 | 12 |
| G-44 | R-25 | R-9' | Cl | Zn | 2 | 2 | 12 |
| G-45 | R-26 | — | Cl | Zn | 4 | 0 | 12 |
| G-46 | R-27 | — | Cl | Zn | 4 | 0 | 12 |
| G-47 | R-28 | — | Cl | Zn | 4 | 0 | 12 |
| G-48 | R-1 | R-1' | Cl | Zn | 1 | 3 | 12 |
| G-49 | R-1 | R-1' | Cl | Zn | 1 | 2 | 13 |
| G-50 | R-1 | R-1' | Cl | Zn | 2 | 1 | 13 |

TABLE 6

| | R | R' | X | M | a | b | c |
|---|---|---|---|---|---|---|---|
| G-51 | R-1 | — | Cl | Zn | 5 | 0 | 11 |
| G-52 | R-1 | — | Cl | Zn | 2 | 0 | 14 |
| G-53 | R-1 | R-1' | Cl | Zn | 4 | 1 | 11 |
| G-54 | R-1 | R-1' | Cl | Zn | 3 | 2 | 11 |
| G-55 | R-1 | R-1' | Cl | Zn | 2 | 3 | 11 |
| G-56 | R-1 | R-1' | Cl | Zn | 1 | 2 | 13 |

TABLE 6-continued

| | R (in General Formula (1), $R^1$ to $R^4$) | R' (in General Formula (1), $R^1$ to $R^4$) | X (in General Formula (1), $X^1$ to $X^4$) | M | a | b | c (in General Formula (1), total sum of $m^1$ to $m^4$) |
|---|---|---|---|---|---|---|---|
| G-57 | R-1 | — | Cl | 2 H's | 4 | 0 | 12 |
| G-58 | R-1 | — | Cl | Ti (=O) | 4 | 0 | 12 |
| G-59 | R-1 | — | Cl | V (=O) | 4 | 0 | 12 |
| G-60 | R-1 | — | Cl | AlCl | 4 | 0 | 12 |

TABLE 7

| | R (in General Formula (1), $R^1$ to $R^4$) | R' (in General Formula (1), $R^1$ to $R^4$) | X (in General Formula (1), $X^1$ to $X^4$) | M | a | b | c (in General Formula (1), total sum of $m^1$ to $m^4$) |
|---|---|---|---|---|---|---|---|
| G-61 | R-1 | — | Cl | $TiCl_2$ | 4 | 0 | 12 |
| G-62 | R-1 | — | Cl | $SiCl_2$ | 4 | 0 | 12 |
| G-63 | R-1 | — | Cl | $SnCl_2$ | 4 | 0 | 12 |
| G-64 | R-29 | — | Cl | Zn | 4 | 0 | 12 |
| G-65 | R-30 | — | Cl | Zn | 4 | 0 | 12 |
| G-66 | R-31 | — | Cl | Zn | 4 | 0 | 12 |

TABLE 8

| | R (in General Formula (1), $R^1$ to $R^4$) | R' (in General Formula (1), $R^1$ to $R^4$) | X (in General Formula (1), $X^1$ to $X^4$) | M | a | b | c (in General Formula (1), total sum of $m^1$ to $m^4$) |
|---|---|---|---|---|---|---|---|
| G-67 | R-32 | — | Cl | Zn | 4 | 0 | 12 |
| G-68 | R-32 | R-10' | Cl | Zn | 2 | 2 | 12 |
| G-69 | R-32 | R-11' | Cl | Zn | 2 | 2 | 12 |
| G-70 | R-33 | R-10' | Cl | Zn | 2 | 2 | 12 |
| G-71 | R-34 | R-10' | Cl | Zn | 2 | 2 | 12 |

[Chem. 14]

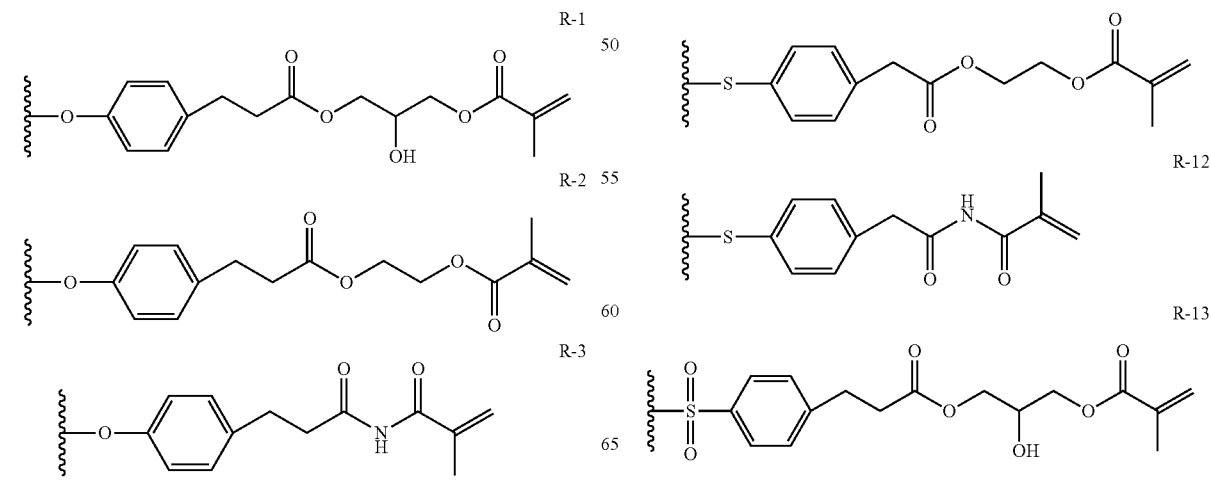

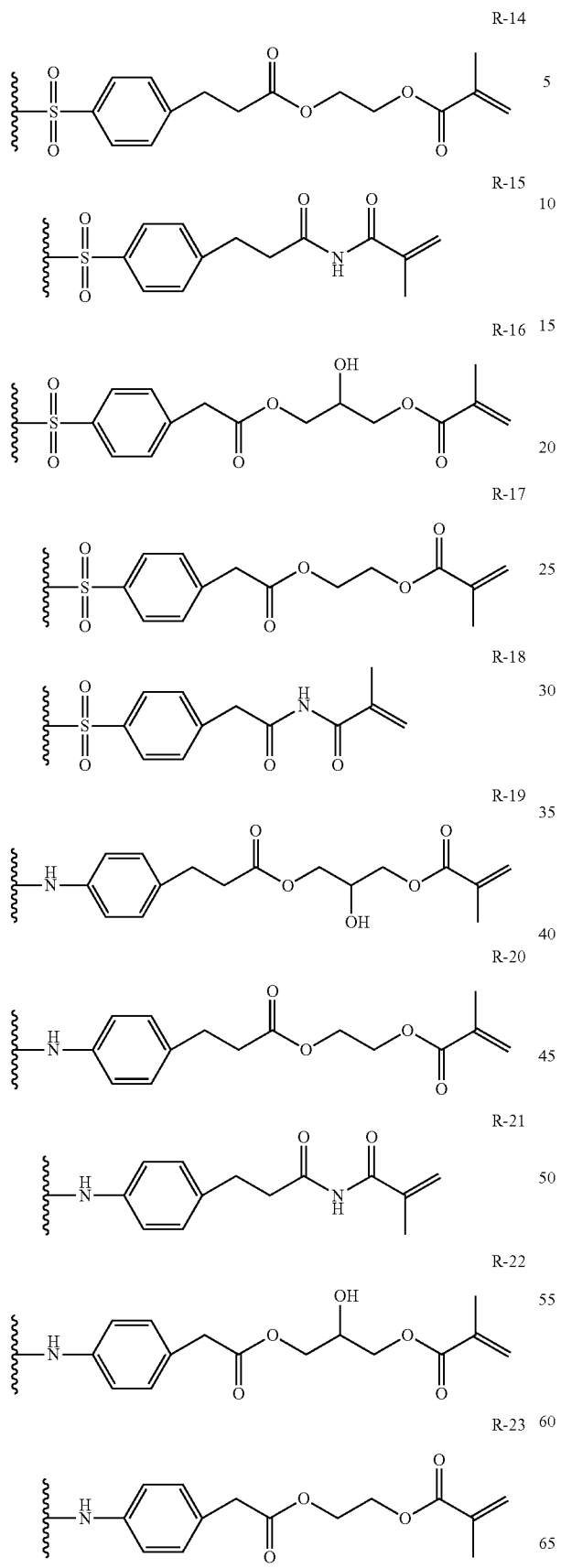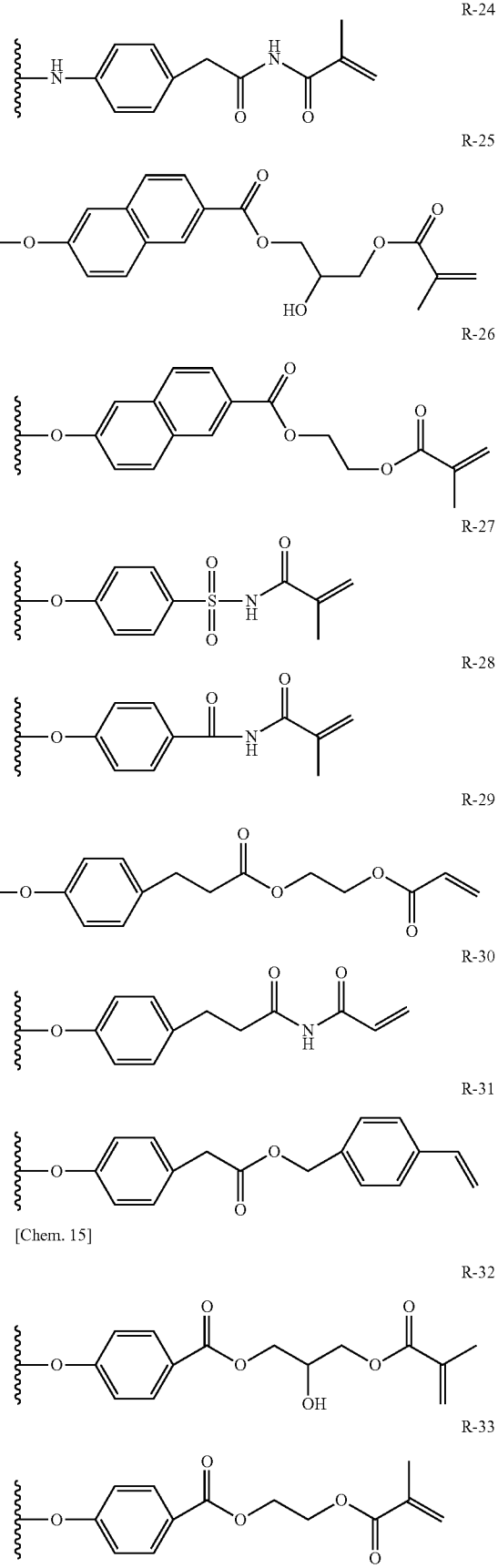

R-34

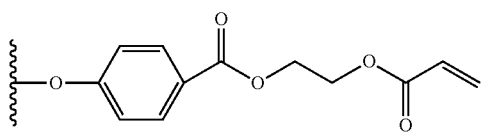

[Chem. 16]

R-1'

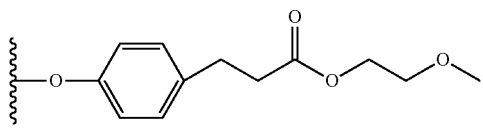

R-2'

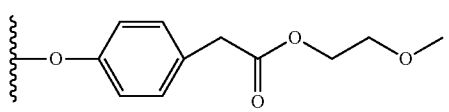

R-3'

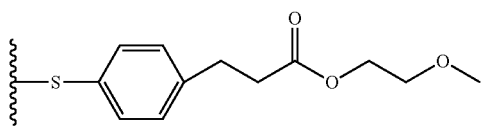

R-4'

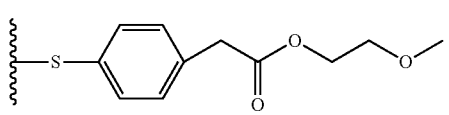

R-5'

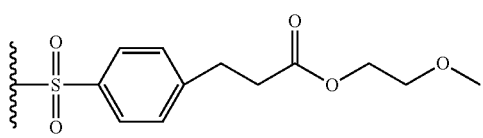

R-6'

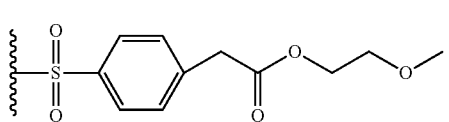

R-7'

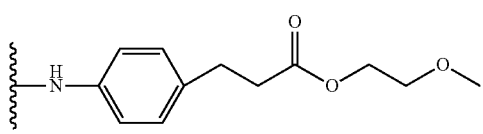

R-8'

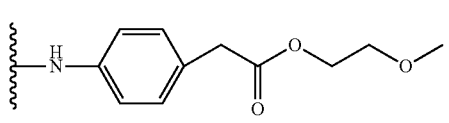

R-9'

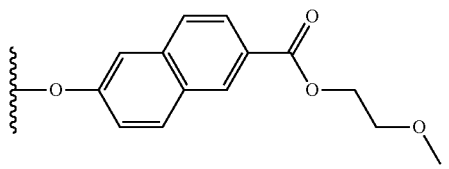

[Chem. 17]

R-10'

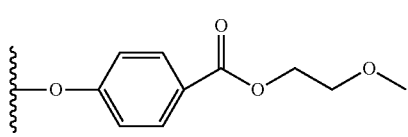

R-11'

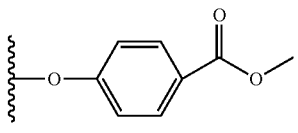

The compound according to general formula (1) can be synthesized according to the methods disclosed in "Phthalocyanines as Functional Dye", published by Industrial Publishing & Consulting, Inc., and "Phthalocyanines—Chemistry and Function—", published by Industrial Publishing & Consulting, Inc", or the like.

The colored curable composition of the present invention preferably further includes a curable compound. Examples of the curable compound include alkali soluble resins or polymerizable compounds.

[Alkali Soluble Resin]

The colored curable composition of the present invention may contain at least 1 type of alkali soluble resin. The alkali soluble resin is not particularly limited other than having alkali solubility, and preferably can be selected from the viewpoint of heat resistance, developability or availability.

The alkali soluble resin is preferably a linear organic high molecular weight polymer and, by being dissolvable in a solvent, developable in a alkalescent water solution. Examples of such a linear organic high molecular weight polymers include polymers having a carboxylic acid on a side chain, such as methacrylic acid copolymers, acrylic acid copolymers, itaconic acid copolymers, crotonic acid copolymers, maleic acid copolymers or partially esterified maleic acid copolymers as disclosed in the publications of JP1984-44615A (JP-S59-446125A), JP1979-3427B (JP-S54-34327B), JP1983-12577B (JP-S58-12577B), JP1979-24957B (JP-S54-25957B), JP1984-53836A (JP-S59-53836A), or JP1984-71048A (JP-S59-71048A); similarly, a cellulose derivative having a carboxylic acid on a side chain is useful.

In addition to those described above, as the alkali soluble resin in the present invention, a polymer to which an acid anhydride is added to a polymer having a hydroxyl group or the like, a polyhydroxystyrene resin, polysiloxane-based resin, a poly(2-hydroxyethyl (meth)acrylate), polyvinyl pyrrolidone, polyethylene oxide, polyvinyl alcohol or the like are useful. In addition, the linear organic high molecular weight polymer may be a copolymer with a monomer having hydrophilicity. Examples thereof include, alkoxyalkyl (meth)acrylate, hydroxyalkyl (meth)acrylate, glycerol (meth)acrylate, (meth)acrylamide, N-methylol acrylamide, secondary or tertiary alkyl acrylamide, dialkylaminoalkyl (meth)acrylate, morpholine (meth)acrylate, N-vinyl pyrrolidone, N-vinyl caprolactam, vinyl imidazole, vinyl triazole, methyl (meth)acrylate, ethyl (meth)acrylate, branched or linear propyl (meth)acrylate, branched or linear butyl (meth)acrylate, or phenoxy hydroxypropyl (meth)acrylate. Additionally, as a monomer having hydrophilicity, monomers including a tetrahydrofurfuryl group, a phosphoric acid group, a phosphoric acid ester group, a quaternary ammonium salt group, an ethyleneoxy chain, a propyleneoxy chain, sulfonic acid group and groups derived from salts thereof, a morpholinoethyl group or the like are useful.

In addition, alkali soluble resin may have a polymerizable group on a side chain in order to improve the crosslinking efficiency, and, for example, a polymer containing an allyl group, a (meth)acryl group, or an allyloxyalkyl group on a side chain is useful. Examples of polymers containing the above-described polymerizable groups include the commercially available KS-resist 106 (manufactured by Osaka Organic Chemical Industries, Ltd.) or Cyclomer-P series (manufactured by Daicel Chemical Industries Co.). In addition, an alcohol soluble nylon, or a polyether such as 2,2-bis-(4-hydroxyphenyl)-propane or epichlorohydrin is useful to increase the strength of a cured coating film.

Among these various alkali soluble resins, a polyhydroxystyrene-based resin, a polysiloxane-based resin, an acrylic-based resin, an acrylamide-based resin, or an acrylic/acrylamide copolymer resin is preferable from the viewpoint of heat resistance; and an acrylic-based resin, an acrylamide-based resin, or an acrylic/acrylamide copolymer resin is preferable from the viewpoint of a developability control.

As the acrylic resin, a copolymer formed from monomers selected from benzyl (meth)acrylate, (meth)acrylate, allyl (meth)acrylate, hydroxyethyl (meth)acrylate, (meth)acrylamide or the like, or commercially available products such as KS-resist 106 (manufactured by Osaka Organic Chemical Industries, Ltd.) or the Cyclomer-P series (manufactured by Daicel Chemical Industries Co.) are preferable.

From the viewpoint of developability, liquid viscosity or the like, the alkali soluble resin is preferably a polymer with a weight average molecular weight (polystyrene conversion value measured using a GPC method) of 1000 to $2 \times 10^5$, more preferably a polymer of 2000 to $1 \times 10^5$, and particularly preferably a polymer of 5000 to $5 \times 10^4$.

The mixing quantity of the alkali soluble resin, in a case where the composition of the present invention is included, is preferably 10 to 80 mass % of the total solid content, and more preferably 15 to 60 mass %. The alkali soluble resin may include only one type or may include two or more types.

[Polymerizable Compound]

The colored curable composition of the present invention may contain at least one type of polymerizable compound. The polymerizable compound may be appropriately selected in consideration of the manufacturing process of the color filter. Examples of the polymerizable compound include either or both of photosensitive compounds and thermosetting compounds, and a photosensitive compound is preferable.

The polymerizable compound is selected, specifically, from compounds having at least 1, and preferably 2 or more, ethylenic unsaturated terminal bond. This group of compounds is widely known in the related industry field and these may be used without particular limitation in the present invention. These may be any chemical form of, for example, a monomer, a prepolymer, that is, a dimer, a trimer, and an oligomer, or a mixture thereof and a polymer thereof and the like. The polymerizable compound in the present invention may be used either alone or as a combination of two or more types.

More specifically, as examples of the monomer and the prepolymer, unsaturated carboxylic acids (for example, acrylic acid, methacrylic acid, itaconic acid, crotonic acid, isocrotonic acid, maleic acid and the like) or esters thereof, amides thereof, and polymers thereof may be included and preferably, esters of unsaturated carboxylic acids and aliphatic multivalent alcohol compounds and amides of unsaturated carboxylic acids and an aliphatic multivalent amine compounds and polymers thereof are included. Also, addition reaction products of unsaturated carboxylic acid esters or amides having nucleophilic substituents such as a hydroxyl group, an amino group, a mercapto group or the like and monofunctional or multifunctional isocyanates or epoxies, or dehydration condensation reaction products with monofunctional or multifunctional carboxylic acids or the like are suitably used. In addition, addition reaction products of unsaturated carboxylate esters or amides having electrophilic substituents such as an isocyanate group or an epoxy group or the like and monofunctional or multifunctional alcohols, amines or thiols, or substituted reaction products of unsaturated carboxylate esters or amides having dissociating substituents such as a halogen group or a tosyloxy group and monofunctional or multifunctional alcohols, amines or thiols are also suitably used. Moreover, as other examples, the use of a compound group substituted with a vinyl benzene derivative such as unsaturated phosphonic acid, styrene or the like, vinyl ether, allyl ether or the like instead of the unsaturated carboxylic acids is possible.

As examples of these specific compounds, the compounds disclosed in paragraph numbers <0095> to <0108> of JP2009-288705A may also be suitably used in the present invention.

Furthermore, as the polymerizable compound, a compound having at least one ethylene group capable of polyaddition as a polymerizable monomer and having an ethylenic unsaturated group with the boiling point of 100° C. or more under atmospheric pressure is also preferable. As examples thereof, a monofunctional acrylate or methacrylate such as polyethylene glycol mono(meth)acrylate, polypropylene glycol mono(meth)acrylate, phenoxyethyl(meth)acrylate; a multifunctional acrylate or methacrylate such as polyethylene glycol di(meth)acrylate, trimethylolethane tri(meth)acrylate, neopentyl glycol di(meth)acrylate, pentaerythritol tri(meth)acrylate, pentaerythritol tetra(meth)acrylate, dipentaerythritol penta(meth)acrylate, dipentaerythritol hexa(meth)acrylate, hexanediol (meth)acrylate, trimethylolpropane tri(acryloyloxypropyl)ether, tri(acryloyloxypropyl) isocyanurate, converted (meth)acrylate after adding ethylene oxide or propylene oxide to polyfunctional alcohols such as glycerin or trimethylolethane, urethane (meth)acrylates such as those disclosed in each of JP1973-41708B (JP-S48-41708B), JP1975-6034B (JP-S50-6034B), and JP1976-37193A (JP-S51-37193A), polyester acrylates such as those disclosed in each of JP1973-64183A (JP-S48-64183A), JP1974-43191B (JP-S49-43191B), and JP1977-30490B (JP-S52-30490B), and epoxyacrylates which are products of epoxy resin and (meth)acrylate and these mixtures may be included.

Multifunctional (meth)acrylate obtained from the reaction of a cyclic ether group such as glycidyl (meth)acrylate and a compound having an ethylenic unsaturated group with multifunctional carboxylic acid may also be included.

Also, as a preferable polymerizable compound, compounds having a fluorene ring and a difunctional or more ethylenic polymeric group which is disclosed in JP2010-160418A, JP2010-129825A, JP4364216B, and the like or cardo resin may also be used.

In addition, as the compound having a boiling point of 100° C. or more under atmospheric pressure and having at least one ethylenic unsaturated group capable of polyaddition, compounds disclosed in paragraph numbers <0254> to <0257> of JP2008-292970A are also suitable.

[Chem. 18]

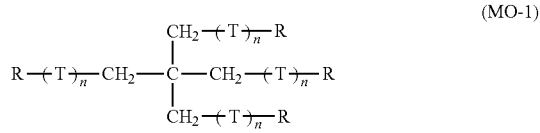

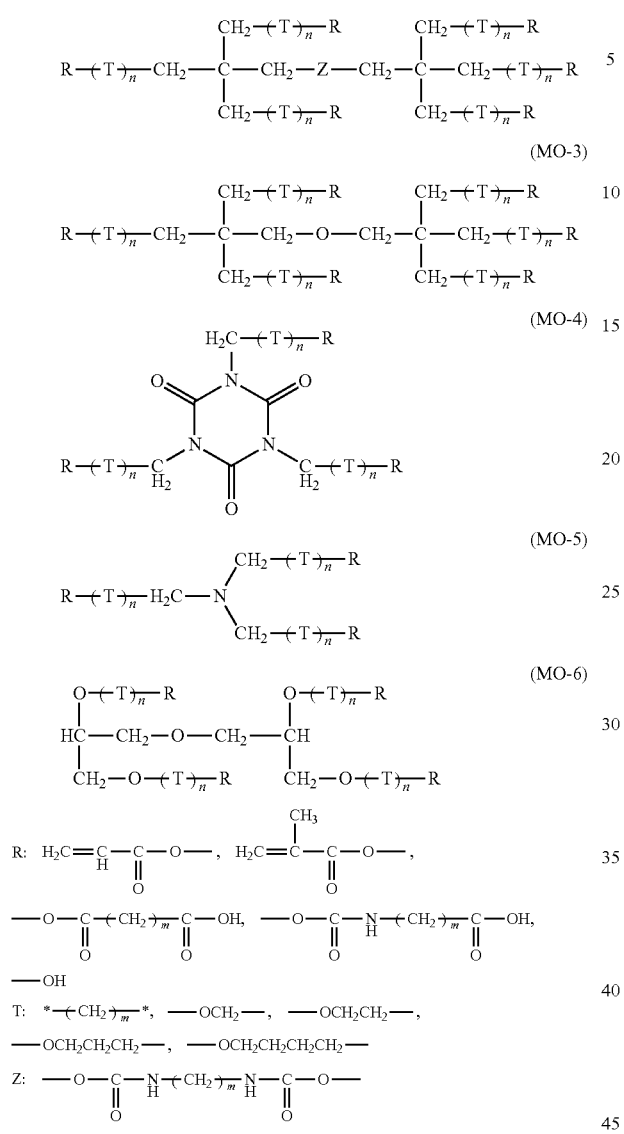

(In the formula, each n is 0 to 14, and each m is 1 to 8. R, T and Z which are plurally present in one molecule may be the same as or different from each other. When T is an oxyalkylene group, the end of the carbon atom side is bonded to R. At least 3 of the R's are polymerizable groups.)

n is preferably 0 to 5, and more preferably 1 to 3.

m is preferably 1 to 5, and more preferably 1 to 3.

As R,

[Chem. 19]

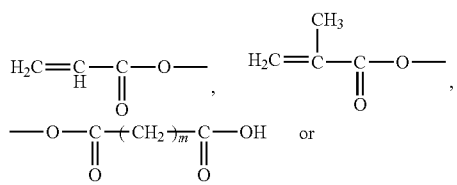

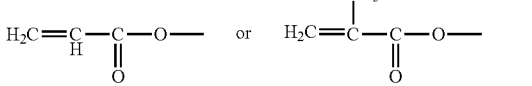

is preferable, and

[Chem. 20]

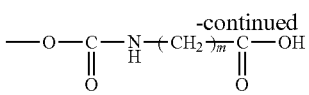

is more preferable.

As specific examples of the radical polymerizable monomer represented by the above general formulae (MO-1) to (MO-6), the compounds disclosed in paragraphs <0248> or <0251> of JP2007-269779A can be suitably used.

Also, the converted (meth)acrylate compound after adding ethylene oxide or propylene oxide to the polyfunctional alcohols disclosed as General Formulae (1) and (2) with specific examples in JP1998-62986A (JP-H10-62986A) may also be used as the polymerizable compound.

Among these, as the polymerizable compound, dipentaerythritol triacrylate, dipentaerythritol tetraacrylate, dipentaerythritol penta(meth)acrylate, dipentaerythritol hexa(meth)acrylate, and structures thereof in which a (meth)acryloyl group using an ethylene glycol or a propylene glycol residue as an intermediary are preferable. Oligomer types thereof can be used.

The polymerizable compound may have an acidic group such as a carboxyl group, a sulfonate group, or a phosphate group as a multifunctional monomer. If the ethylenic compound has an unreacted carboxyl group as in the case of the mixture as above, this may be used as it is; however, as necessary, an acidic group may be introduced by reacting a non-aromatic carboxylic anhydride with a hydroxyl group of the ethylenic compound described above. In this case, as specific examples of the non-aromatic carboxylic anhydride used, tetrahydrophthalic anhydride, alkylated tetrahydrophthalic anhydride, hexahydrophthalic anhydride, alkylated hexahydrophthalic anhydride, succinic anhydride, maleic anhydride and the like may be included.

In the present invention, as the monomer having an acid value, an ester of aliphatic polyhydroxy compound with unsaturated carboxylic acid and a multifunctional monomer made to have an acidic group by reacting an unreacted hydroxyl group of aliphatic polyhydroxy compound with a non-aromatic carboxylic anhydride is preferable. In this ester, the aliphatic polyhydroxy compound being pentaerythritol and/or dipentaerythritol is particularly preferable. As commercially available products, for example, M-510 and M-520 as polybasic modified acryl oligomers manufactured by Toagosei Co., Ltd. may be included.

These monomers may be used alone, or may be used as a combination of two or more since it is difficult to use a single compound in the manufacturing. Also, if necessary, a multifunctional monomer which does not have an acidic group and a multifunctional monomer which has an acidic group may be used together as the monomer.

Preferable acid values of a polyfunctional monomer having an acid group are 0.1 to 40 mgKOH/g, and particularly preferable is 5 to 30 mgKOH/g. If the acid value of the multifunctional monomer is excessively low, developing dissolution characteristics becomes worse and if excessively high, preparation or handling becomes difficult, therefore photopolymerization performance becomes low and a curing property such as surface smoothness of the pixel becomes inferior. Therefore, when two or more multifunctional monomers of different acid groups are used together, or when the multifunctional monomer which does not have an acidic group is used together, it is preferable that the acid group as the total multifunctional monomer be adjusted to be within the ranges described above.

In regard to these polymerizable compounds, the specifics of the usage method, such as the configuration thereof, whether used independently or in combination, or the addition amount, may be arbitrarily set in accordance with the final performance design of the composition. For example, from a viewpoint of sensitivity, a configuration in which the unsaturated group content per molecule is large is preferable, and in most cases difunctional or more is preferable. Also, from the viewpoint of increasing the strength of the coloring curable film, a trifunctional or more polymerizable compound is favorable, and furthermore, by using a polymerizable compound of a different number of functional groups or different polymerizable groups (for example, acrylate esters, methacrylate esters, styrene-based compounds, or vinyl ether compounds) together therewith, a method of adjusting both of sensitivity and strength is valid. Furthermore, using trifunctional or more polymerizable compounds together which have different ethylene oxide chain lengths is preferable due to the point that the developability of the composition may be adjusted, and excellent pattern formability may be obtained. In addition, the method of selection and use of the polymerizable compound is an important factor with respect to the compatibility and dispersibility with the other components (for example, photopolymerization initiator, colorant (pigment), binder polymer, or the like) contained in the composition. For example, there are cases where the compatibility can be improved by use of a low purity compound or by combined use of two or more types. Also, it is also possible to select a specific configuration from the viewpoint of improving the adhesion to hard surfaces, such as a substrate.

The content of the polymerizable compound (the total content in a case of two or more types) in the total solid content of the colored curable composition is not particularly limited; however, from the viewpoint of more effectively obtaining the effect of the present invention, the content is preferably 2 mass % to 80 mass %, more preferably 5 mass % to 75 mass %, and particularly preferably 10 mass % to 60 mass %.

[Photopolymerization Initiator]

The colored curable composition of the present invention may contain at least one type of photopolymerization initiator. The photopolymerization initiator is not particularly limited as long as it is able to cause polymerization of the polymerizable compound, and is preferably chosen from the viewpoint of characteristics, initiation efficiency, absorption wavelength, availability, cost and the like.

Examples of the photopolymerization initiator include at least one active halogen compound selected from halomethyl oxadiazole compounds and halomethyl-s-triazine compounds, 3-aryl substituted coumarin compounds, lophine dimers, benzophenone compounds, acetophenone compounds and derivatives thereof, cyclopentadiene-benzene-iron complex and salts thereof, or oxime compounds. Specific examples of the photopolymerization initiator include those disclosed in paragraphs <0070> to <0077> of JP2004-295116A. Among these oxime compounds or biimidazole-based compounds are preferable from the point of rapidity of polymerization reaction and the like.

The oxime compound is not particularly limited, and examples include the oxime compounds disclosed in JP2000-80068A, WO02/100903A1 or JP2001-233842.

Specific examples thereof include 2-(O-benzoyl oxime)-1-[4-(phenylthio)phenyl]-1,2-butanedione, 2-(O-benzoyl oxime)-1-[4-(phenylthio)phenyl]-1,2-pentanedione, 2-(O-benzoyl oxime)-1-[4-(phenylthio)phenyl]-1,2-hexanedione, 2-(O-benzoyl oxime)-1-[4-(phenylthio)phenyl]-1,2-heptanedione, 2-(O-benzoyl oxime)-1-[4-(phenylthio)phenyl]-1,2-octanedione, 2-(O-benzoyl oxime)-1-[4-(methyl)phenyl]-1,2-butanedione, 2-(O-benzoyl oxime)-1-[4-(ethyl)phenyl]-1,2-butanedione, 2-(O-benzoyl oxime)-1-[4-(butyl)phenyl]-1,2-butanedione, 1-(O-acetyl oxime)-1-[9-ethyl-6-(2-methyl-benzoyl)-9H-carbazol-3-yl]ethanone, 1-(O-acetyl oxime)-1-[9-methyl-6-(2-methyl-benzoyl)-9H-carbazol-3-yl]ethanone, 1-(O-acetyl oxime)-1-[9-propyl-6-(2-methyl-benzoyl)-9H-carbazol-3-yl]ethanone, 1-(O-acetyl oxime)-1-[9-ethyl-6-(2-ethyl-benzoyl)-9H-carbazol-3-yl]ethanone, 1-(O-acetyl oxime)-1-[9-ethyl-6-(2-butyl-benzoyl)-9H-carbazol-3-yl]ethanone, 2-(benzoyloxy-imino)-1-[4-(phenylthio)phenyl]-1-octanone, 2-(acetoxyimino)-4-(4-chlorophenylthio)-1-[9-ethyl-6-(2-methyl-benzoyl)-9H-carbazol-3-yl]-1-butanone. However, the present invention is not limited thereto.

In addition, in the present invention, compounds represented by general formula (I) below are preferable as the oxime compound from the viewpoint of sensitivity, stability over time, or coloring during post-baking.

[Chem. 21]

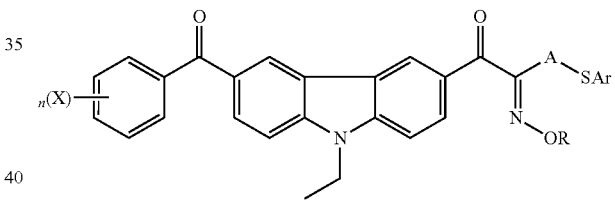

(1)

(In general formula (I), R and X each represents a monovalent substituent, A represents a divalent organic group, and Ar represents an aryl group. n is an integer of from 1 to 5.)

From the point of becoming highly sensitive, R is preferably an acyl group, and specifically, an acetyl group, a propionyl group, a benzoyl group, or a toluoyl group is preferable.

As A, an unsubstituted alkylene group, an alkylene group substituted with an alkyl group (for example, a methyl group, an ethyl group, a tert-butyl group, or a dodecyl group), an alkylene group substituted with an alkenyl group (for example, a vinyl group or an allyl group), and an alkylene group substituted with an aryl group (for example, a phenyl group, a p-tolyl group, a xylyl group, a cumenyl group, a naphthyl group, an anthryl group, a phenanthryl group, or a styryl group) are preferable from the viewpoint of increasing sensitivity and suppressing coloring due to heating over time.

As Ar, a substituted or unsubstituted phenyl group is preferable from the viewpoint of increasing sensitivity and suppressing coloring due to heating over time. In the case of a substituted phenyl group, the substituent is preferably a halogen atom, such as a fluorine atom, a chlorine atom, bromine atom or an iodine atom.

From the viewpoint of improving solvent solubility and absorption efficiency in the long wavelength region, X is preferably an alkyl group which may have a substituent, an aryl group which may have a substituent, an alkenyl group which may have a substituent, an alkynyl group which may have a substituent, an alkoxy group which may have a substituent, an aryl group which may have a substituent, an alkylthioxy group which may have a substituent, an arylthioxy group which may have a substituent or an amino group which may have a substituent.

In addition, n in general formula (I) is preferably an integer of 1 to 2.

The structure of the biimidazole-based compound is not limited if it is a dimer of an imidazole ring substituted with 3 aryl groups, and can be used. In particular, a compound having a structure represented by general formula (II) below or general formula (III) is preferable.

[Chem. 22]

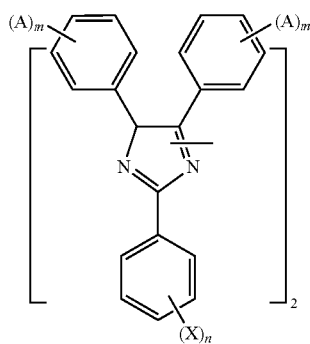

(II)

In general formula (II), X represents a hydrogen atom, a halogen atom, a cyano group, an alkyl group having 1 to 4 carbon atoms or an aryl group having 6 to 9 carbon atoms, each A represents a substituted or unsubstituted alkoxy group having 1 to 12 carbon atoms, or —COO—$R^9$ (wherein, $R^9$ represents an alkyl group having 1 to 4 carbon atoms or an aryl group having 6 to 9 carbon atoms), n is an integer of 1 to 3, and m is an integer of 1 to 3.

[Chem. 23]

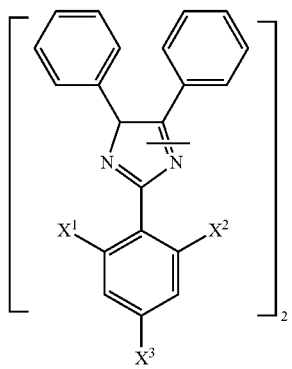

(III)

In general formula (III), $X^1$, $X^2$ and $X^3$ each independently represent a hydrogen atom, a halogen atom, a cyano group, an alkyl group having 1 to 4 carbon atoms, or an aryl group having 6 to 9 carbon atoms. However, two or more of $X^1$, $X^2$ and $X^3$ may not be hydrogen atoms at the same time.

Examples of the biimidazole-based compound include, specifically, biimidazole compounds such as 2,2'-bis(2-chlorophenyl)-4,4',5,5'-tetraphenylbiimidazole, 2,2'-bis(2-chlorophenyl)-4,4',5,5'-tetrakis(4-ethoxycarbonylphenyl)biimidazole, 2,2'-bis(2-chlorophenyl)-4,4',5,5'-tetrakis(4-phenoxycarbonylphenyl)biimidazole, 2,2'-bis(2,4-dichlorophenyl)-4,4',5,5'-tetrakis(4-ethoxycarbonylphenyl)biimidazole, 2,2'-bis(2,4-dichlorophenyl)-4,4',5,5'-tetrakis(4-phenoxycarbonylphenyl)biimidazole, 2,2'-bis(2,4,6-trichlorophenyl)-4,4',5,5'-tetrakis(4-ethoxycarbonylphenyl)biimidazole, 2,2'-bis(2,4,6-trichlorophenyl)-4,4',5,5'-tetrakis(4-phenoxycarbonylphenyl)biimidazole,
2,2'-bis(2-cyanophenyl)-4,4',5,5'-tetrakis(4-ethoxycarbonylphenyl)biimidazole, 2,2'-bis(2-cyanophenyl)-4,4',5,5'-tetrakis(4-phenoxycarbonylphenyl)biimidazole, 2,2'-bis(2-methylphenyl)-4,4',5,5'-tetrakis(4-methoxycarbonylphenyl)biimidazole, 2,2'-bis(2-methylphenyl)-4,4',5,5'-tetrakis(4-ethoxycarbonylphenyl)biimidazole, 2,2'-bis(2-methylphenyl)-4,4',5,5'-tetrakis(4-phenoxycarbonylphenyl)biimidazole, 2,2'-bis(2-ethylphenyl)-4,4',5,5'-tetrakis(4-methoxycarbonylphenyl)biimidazole, 2,2'-bis(2-ethylphenyl)-4,4',5,5'-tetrakis(4-ethoxycarbonylphenyl)biimidazole, 2,2'-bis(2-ethylphenyl)-4,4',5,5'-tetrakis(4-phenoxycarbonylphenyl)biimidazole, 2,2'-bis(2-phenylphenyl)-4,4',5,5'-tetrakis(4-methoxycarbonylphenyl)biimidazole, 2,2'-bis(2-phenylphenyl)-4,4',5,5'-tetrakis(4-ethoxycarbonylphenyl)biimidazole, or 2,2'-bis(2-phenylphenyl)-4,4',5,5'-tetrakis(4-phenoxycarbonylphenyl)biimidazole;

and biimidazole compounds such as 2,2'-bis(o-chlorophenyl)-4,4',5,5'-tetra-(p-methoxyphenyl)bisimidazole, 2,2'-bis(o-chlorophenyl)-4,4',5,5'-tetra-(m-methoxyphenyl)bisimidazole, 2,2'-bis(o-chlorophenyl)-4,4',5,5'-tetra-(3,4-dimethoxyphenyl)bisimidazole, 2,2'-bis(2-chlorophenyl)-4,4',5,5'-tetra-(4-methoxyphenyl)bisimidazole, 2,2'-bis(2-chlorophenyl)-4,4',5,5'-tetra-(3-methoxyphenyl)bisimidazole, 2,2'-bis(2-chlorophenyl)-4,4',5,5'-tetra-(3,4-dimethoxyphenyl)bisimidazole,
2,2'-bis(2,4-dichlorophenyl)-4,4',5,5'-tetraphenylbiimidazole, 2,2'-bis(2,4,6-trichlorophenyl)-4,4',5,5'-tetraphenylbiimidazole, 2,2'-bis(2,4-dibromophenyl)-4,4',5,5'-tetraphenylbiimidazole, 2,2'-bis(2,4,6-tribromophenyl)-4,4',5,5'-tetraphenylbiimidazole, 2,2'-bis(2,4-dicyanophenyl)-4,4',5,5'-tetraphenylbiimidazole, 2,2'-bis(2,4,6-tricyanophenyl)-4,4',5,5'-tetraphenylbiimidazole, 2,2'-bis(2,4-dimethylphenyl)-4,4',5,5'-tetraphenylbiimidazole, 2,2'-bis(2,4,6-trimethylphenyl)-4,4',5,5'-tetraphenylbiimidazole, 2,2'-bis(2,4-diethylphenyl)-4,4',5,5'-tetraphenylbiimidazole,
2,2'-bis(2,4,6-triethylphenyl)-4,4',5,5'-tetraphenylbiimidazole, 2,2'-bis(2,4-diphenylphenyl)-4,4',5,5'-tetraphenylbiimidazole, 2,2'-bis(2,4,6-triphenylphenyl)-4,4',5,5'-tetraphenylbiimidazole, 2,2'-bis(2-fluorophenyl)-4,4',5,5'-tetraphenyl-bis imidazole, or 2,2'-bis(o-fluorophenyl)-4,4',5,5'-tetraphenyl-bisimidazole.

Among the above formulae, examples of particularly preferable compounds include 2,2'bis(2-chlorophenyl)-4,4',5,5'-tetraphenylbiimidazole (examples of commercially available products include B-CIM, manufactured by Hodogaya Chemical Co., Ltd.), 2,2'-bis(o-chlorophenyl)-4,4',5,5'-tetra-(3,4-dimethoxyphenyl)biimidazole (HABI1311, Japan Sebel Hegner), 2,2'-bis(2-methylphenyl)-4,4',5,5'-tetraphenylbiimidazole (commercially available from Kurogane Kasei Co.).

In addition, in the colored curable composition of the present invention, in addition to the above-described photopolymerization initiator, other known photopolymerization initiators disclosed in paragraph <0079> of JP2004-295116A may be used.

The photopolymerization initiator can be used as one type independently or can contain a combination of two or more types.

The content of the photopolymerization initiator (the total content in a case of two or more types) in the total solid content of the colored curable composition is preferably 3 mass % to 20 mass %, and more preferably 4 mass % to 19 mass % from the viewpoint of more effectively obtaining the effect of the present invention.

[Colorant]

The colored curable composition of the present invention may further include dye compounds or pigment compounds with other structures, or dispersions thereof. The dye compound may have any structure if it does not influence the hue of a colored image, and examples thereof include azo-based (for example, Solvent Yellow 162), anthraquinone-based (for example, an anthraquinone compound disclosed in JP2001-10881A), phthalocyanine-based (for example, a phthalocyanine compound disclosed in US2008/0076044A1), xanthene-based (for example, C.I. Acid Red 289), triarylmethane-based (for example, C.I. Acid Blue 7, C.I. Acid Blue 83, C.I. Acid Blue 90, C.I. Solvent Blue 38, C.I. Acid Violet 17, C.I. Acid Violet 49, C.I. Acid Green 3) or methine dyes.

As pigment compounds, examples include perylene, perynone, quinacridone, quinacridonequinone, anthraquinone, anthanthrone, benzimidazolon, disazo condensate, disazo, azo, indanthrones, phthalocyanine, triarylcarbonium, dioxazine, aminoanthraquinone, diketopyrrolopyrroles, indigo, thioindigo, isoindoline, isoindolinone, pyranthrone or isoviolanthrone. In further detail, examples include perylene compound pigments, such as Pigment Red 190, Pigment Red 224, Pigment Violet 29; perinone compound pigments, such as Pigment Orange 43, or Pigment Red 194; quinacridone compound pigments, such as Pigment Violet 19, Pigment Violet 42, Pigment Red 122, Pigment Red 192, Pigment Red 202, Pigment Red 207, or Pigment Red 209; quinacridonequinone compound pigments, such as Pigment Red 206, Pigment Orange 48, or Pigment Orange 49; anthraquinone compound pigments, such as Pigment Yellow 147; anthanthrone compound pigments, such as Pigment Red 168; benzimidazolone compound pigments, such as Pigment Brown 25, Pigment Violet 32, Pigment Orange 36, Pigment Yellow 120, Pigment Yellow 180, Pigment Yellow 181, Pigment Orange 62, or Pigment Red 185; disazo condensate compound pigments, such as Pigment Yellow 93, Pigment Yellow 94, Pigment Yellow 95, Pigment Yellow 128, Pigment Yellow 166, Pigment Orange 34, Pigment Orange 13, Pigment Orange 31, Pigment Red 144, Pigment Red 166, Pigment Red 220, Pigment Red 221, Pigment Red 242, Pigment Red 248, Pigment Red 262, or Pigment Brown 23; azo compound pigments, such as Pigment Yellow 13, Pigment Yellow 83, or Pigment Yellow 188; azo compound pigments, such as Pigment Red 187, Pigment Red 170, Pigment Yellow 74, Pigment Yellow 150, Pigment Red 48, Pigment Red 53, Pigment Orange 64, or Pigment Red 247; indanthrone compound pigments, such as Pigment Blue 60; phthalocyanine compound pigments, such as Pigment Green 7, Pigment Green 36, Pigment Green 37, Pigment Green 58, Pigment Blue 16, Pigment Blue 75, or Pigment Blue 15; triarylcarbonium compound pigments, such as Pigment Blue 56, or Pigment Blue 61; dioxazine compound pigments, such as Pigment Violet 23 or Pigment Violet 37; amino anthraquinone compound pigments, such as Pigment Red 177; diketopyrrolopyrrole compound pigments, such as Pigment Red 254, Pigment Red 255, Pigment Red 264, Pigment Red 272, Pigment Orange 71, or Pigment Orange 73; thioindigo compound pigments, such as Pigment Red 88; isoindoline compound pigments, such as Pigment Yellow 139 or Pigment Orange 66; isoindolinone compound pigments, such as Pigment Yellow 109, or Pigment Orange 61; pyranthrone compound pigments, such as Pigment Orange 40 or Pigment Red 216; or isoviolanthrone compound pigments, such as Pigment Violet 31.

As the colorant, a yellow colorant is preferable in the present invention, Pigment Yellow 150 or Pigment Yellow 139 are more preferable as the pigment, and C.I. Solvent Yellow 4, C.I. Solvent Yellow 88, C.I. Solvent Yellow 14, C.I. Solvent Yellow 15, C.I. Solvent Yellow 24, C.I. Solvent Yellow 93, C.I. Solvent Yellow 94, C.I. Solvent Yellow 98, C.I. Solvent Yellow 162 or C.I. Solvent Yellow 82 are more preferable as the dye.

In addition, in the present invention, the yellow colorant is preferably an azo dye or a mono methine dye, and more preferably a mono methine dye in which the yellow colorant is represented by general formula (4) below.

[Chem. 24]

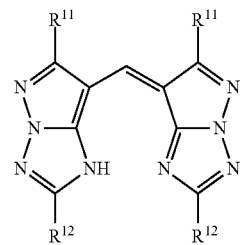

General Formula (4)

(In general formula (4), each $R^{11}$ represents an alkyl group or a vinyl group, and each $R^{12}$ represents an aromatic ring group having a substituent.)

$R^{11}$ is preferably an alkyl group having 1 to 12 carbon atoms, and more preferably an alkyl group having 1 to 6 carbon atoms.

$R^{12}$ is preferably a phenyl group or a naphthyl group. The substituent is preferably an alkylsulfonylamino group, a vinylsulfonylamino group, an arylsulfonylamino group, an alkylcarbonylamino group, a vinylcarbonylamino group, or an arylcarbonylamino group, and particularly preferably an alkylsulfonylamino group. The alkyl group having 1 to 12 carbon atoms may have an unsaturated bond, and examples of such a substituent include an allyl sulfonylamino group.

In a case where the dye or pigment is mixed as a dispersion, the dispersion can be prepared according to the disclosures of JP1997-197118A (JP-H09-197118A) or JP2000-239544A.

The content of the dye or pigment can be used in a range not damaging the effect of the present invention, and is preferably 0.5 mass % to 70 mass % with respect to the total solid content of the colored curable composition of the present invention.

[Solvent]

The colored curable composition of the present invention may contain at least one type of solvent. The solvent is not particularly limited if able to satisfy solubility of each coexisting component or coatability when used as a colored curable composition, and is particularly preferably selected in consideration of coatability or safety.

As the solvent, esters, ethers, ketones, and aromatic hydrocarbons are used. Specifically, examples include those disclosed in paragraphs <0161> to <0162> of JP2012-032754.

These solvents, in a case where solubility of each of the above-described components and an alkali soluble resin are included, mixing two or more types is preferable from the viewpoint of improvement in solubility or coating surface shape. In this case, a mixed solution consisting of two or more types selected from methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether, and propylene glycol methyl ether acetate is particularly preferable.

As the content in the colored curable composition of the solvent, in a case where included in the composition of the present invention, the concentration of the total solid content is preferably 10 mass % to 80 mass %, and more preferably 15 mass % to 60 mass %.

<Surfactant>

Various surfactants may be added to the colored photosensitive composition of the present invention from the viewpoint of further improving coating properties. As the surfactant, various surfactants such as fluorine-based surfactants, nonionic surfactants, cationic surfactants, anionic surfactants, or silicone-based surfactants may be used.

In particular, by containing a fluorine-based surfactant, the liquid characteristics when used as a coating liquid are further improved (in particular, the flowability), and the uniformity of the coating thickness, or liquid saving characteristics can be further improved.

In other words, in a colored photosensitive composition containing a fluorine-based surfactant, by decreasing the surface tension between the coating surface and coating liquid, the wettability of the coating surface is improved, and the coatability on the coating surface is improved. As a result, it is effective in that the film of uniform thickness with small thickness variation is suitably formed even when the thin film of approximately several μm is formed using a small amount of liquid amount.

As fluorine content in the fluorine-based surfactant, 3 mass % to 40 mass % is suitable, 5 mass % to 30 mass % is more preferable, and 7 mass % to 25 mass % is particularly preferable. When the fluorine content rate is within this range, the coating uniformity or liquid saving characteristics is effective, and the solubility in the composition is also good.

Examples of the fluorine-based surfactant include, for example, Megaface F171, Megaface F172, Megaface F173, Megaface F176, Megaface F177, Megaface F141, Megaface F142, Megaface F143, Megaface F144, Megaface R$^{30}$, Megaface F437, Megaface F479, Megaface F482, Megaface F780, or Megaface F781 (the above manufactured by DIC Corporation), Fluorad FC430, Fluorad FC431, or Fluorad FC171 (the above manufactured by Sumitomo 3M Limited), Surflon S-382, Surflon SC-101, Surflon SC-103, Surflon SC-104, Surflon SC-105, Surflon SC1068, Surflon SC-381, Surflon SC-383, Surflon S393, or Surflon KH-40 (the above manufactured by Asahi Glass, Co., Ltd.), or CW-1 (manufactured by Zeneca) or the like.

In addition, specific examples of cationic surfactants include a phthalocyanine derivative (commercially available product, EFKA-745 (manufactured by Morishita and Co., Ltd.)), an organo siloxane polymer KP341 (manufactured by Shin-Etsu Chemical Co., Ltd.), (meth)acrylic acid-based (co) polymers POLYFLOW No. 75, No. 90 and No. 95 (manufactured by Kyoeisha Chemical Co., Ltd.), and W001 (manufactured by Yusho Co., Ltd.).

Specific examples of nonionic surfactants include polyoxyethylene lauryl ether, polyoxyethylene stearyl ether, polyoxyethyleneoleyl ether, polyoxyethylene octylphenyl ether, polyoxyethylene nonylphenyl ether, polyethylene glycol dilaurate, polyethylene glycol distearate, or sorbitan fatty acid ester (such as PLURONIC L10, L31, L61, L62, 10R5, 17R2, 25R2, or TETRONIC 304, 701, 704, 901, 904, 150R1 manufactured by BASF).

As the anionic surfactant, specifically, W004, W005, or W017 (manufactured by Yusho Co. Ltd.) or the like may be included.

Examples of silicone-based surfactants include "Toray Silicone DC3PA", "SH7PA", "DC11PA", "SH21PA", "SH28PA", "SH29PA", "SH30PA", or "SH8400", all manufactured by Toray Silicone Co., Ltd., "TSF-4440" "TSF-4300" "TSF-4445" "TSF-444(4)(5)(6)(7)6", "TSF-4460", or "TSF-4452" all manufactured by Toshiba Silicone Co., Ltd., KP341" manufactured by Shin-Etsu Silicone Co., Ltd., and "BYK323" or "BYK330" manufactured by BYK Chemie Co., Ltd.

The surfactant may either use alone or as a combination of two or more.

The addition amount of the surfactant, in a case where mixed, is preferably 0.001 mass % to 2.0 mass %, more preferably 0.005 mass % to 1.0 mass % with regard to the total mass of the composition.

[Polymerization-Inhibitor]

In the colored curable composition of the present invention, a small amount of polymerization-inhibitor may be added in order to prevent unnecessary thermal polymerization of the polymerizable compound during production or storage of the colored curable composition.

As the polymerization-inhibitor which can be used in the present invention, hydroquinone, p-methoxyphenol, di-t-butyl-p-cresol, pyrogallol, t-butyl catechol, benzoquinone, 4,4'-thiobis(3-methyl-6-t-butylphenol), 2,2'-methylenebis(4-methyl-6-t-butylphenol), cerium(I) salt of N-nitroso phenylhydroxylamine, or the like may be included. In addition, the polymerization-inhibitor disclosed in paragraph <0081> of JP2004-295116 can be contained.

The addition amount in a case where a polymerization-inhibitor is used is preferably in a range of 0.001 mass % to 5 mass % in the total solid content in the colored curable composition, and more preferably 0.003 mass % to 0.09 mass %.

[Crosslinking Agent]

Using the crosslinking agent to supplement the colored curable composition of the present invention, it is possible to further harden the colored cured film formed by curing the colored curable composition.

As the crosslinking agent, as long as film curing may be performed using a crosslinking reaction, there are no particular limitations, for example, a phenyl compound, a naphthyl compound or a hydroxyanthracene compound which is substituted by at least one substituent selected from an (a) epoxy resin, a (b) methylol group, an alkoxymethyl group, and an acyloxymethyl group, and substituted by at least one substituent selected from a melamine compound, a guanamine compound, a glycol lauryl compound or a urea compound, a (c) methylol group, an alkoxymethyl group, and an acyloxymethyl group may be exemplified. Among these, a multifunctional epoxy resin is preferable.

In regard to the details of specific examples of the crosslinking agent, the disclosures of paragraphs <0134> to <0147> of JP2004-295116A may be referred to.

[Other Additives]

Various additives, such as fillers, antioxidants, ultraviolet absorbers, deflocculating agents, sensitizers, and photostabilizers may be added as necessary to the colored curable composition of the present invention.

The colored curable composition of the present invention may be a photocurable composition or may be a thermosetting composition. In a case where the color filter is manufactured according to a dry etching method, a thermosetting composition is preferably used, and in a case of a color filter manufactured according to a photolithography method, a photocurable composition is preferable.

[Preparation Method of Colored Curable Composition]

The colored curable composition of the present invention is prepared by mixing each of the above-described components and arbitrary components as needed.

Moreover, when preparing the colored curable composition, each component which configures the colored curable composition may be mixed in a batch, and may also be mixed successively after dissolving and dispersing each component in a solvent. Also, the introduction order or the operation conditions when mixing are not particularly restricted. For example, all components may be simultaneously dissolved and dispersed in a solvent to prepare the composition, and, as necessary, each component may be set appropriately to 2 or more solvents or dispersion liquids, and when using (when coating), they are mixed and may be prepared as the composition.

The colored curable composition prepared as described above can be provided for use after filtering using a filter or the like preferably having a pore diameter of 0.01 μm to 3.0 μm, and more preferably a pore diameter of 0.05 μm to approximately 0.5 μm.

Because the colored curable composition of the present invention can form a colored cured film with high transmissivity, the composition can be suitably used for forming the colored pixels of a color filter or the like used in a liquid crystal display device (LCD) or a solid-state imaging element (for example, a CCD, CMOS or the like), also used for preparing a printing ink, inkjet ink, painting or the like. In particular, the composition is suitable for use in color pixel formation of a solid-state imaging device, such as a CCD, and a CMOS.

(Color Filter and Manufacturing Method Thereof)

The color filter of the present invention is configured by providing a substrate and a color pattern including the colored curable composition of the present invention on the substrate. The color pattern on the substrate is configured of, for example, red (R), green (G) or blue (B) colored films formed of each pixel of the color filter.

The color filter of the present invention may be formed using any method, if it is a method which can form a cured color pattern by applying the colored curable composition of the present invention on a substrate, and forming by a dry etching method or a photolithography method is preferable.

<Manufacturing Method of Color Filter Using Dry Etching Method>

A method of manufacturing a color filter using the colored curable composition of the present invention using a dry etching method (hereinafter, also called manufacturing method of a color filter using a dry etching method) will be described.

The manufacturing method of a color filter using a dry etching method of the present invention has a step (D-A) of applying (preferably coating) the colored curable composition of the present invention on a substrate and forming a color layer; a step (D-B) of forming a resist layer on the colored layer formed in step (D-A); a step (D-C) of forming a resist pattern by developing and exposing the photoresist layer formed in step (D-B) to a pattern shape; and a step (D-D) of forming a color pattern by dry etching the colored layer with the resist pattern as an etching mask.

By undergoing these steps, a color pattern formed from each color of pixel (3 colors or 4 colors) can be formed, and a color filter can be obtained. Moreover, the term colored layer in the present invention means pixels used in the color filter and/or a layer formed from a black matrix.

Hereinafter, the manufacturing method of a color filter using a dry etching method of the present invention will be described more specifically.

—Step (D-A)—

The colored layer forming step in the manufacturing method of the color filter using a dry etching method of the present invention forms a colored layer using the colored curable composition of the present invention.

As for formation of the colored layer, the colored curable composition of the present invention is applied either directly on a substrate or with another layer interposed. The method of application is preferably coating, and more preferably coating by a coating method such as spin coating, slit coating, flow casting coating, roll coating, bar coating, or ink jet.

The substrate, in addition to a silicon substrate, is not particularly limited if able to be used in a color filter, and examples include those used in a liquid crystal display element, such as soda glass, borosilicate glass, quartz glass, and those on which a transparent conductive layer is attached to these materials, or a photoconversion element substrate used in a solid-state image capture element, such as an oxide layer, or silicon nitride. In addition, an intermediary layer may be provided between these substrates and the color filter as long as it does not damage the present invention.

Here, the thickness of the colored layer is preferably in a range of 0.3 μm to 1 more preferably 0.35 μm to 0.8 μm, and still more preferably 0.35 μm to 0.7 μm.

—Step (D-B)—

Next, in the manufacturing method of a color filter using a dry etching method of the present invention, a photoresist layer is further formed on the colored layer formed on the above-described substrate. Specifically, a photoresist layer can be formed by coating a positive or negative photosensitive resin composition on the colored layer and drying the composition. In formation of photoresist layer, it is preferable to further subject the layer to a pre-baking process. In particular, as the formation process of the photoresist, an embodiment subjecting the layer to a baking process after exposure (PEB) and a baking process after development (post-baking process) is desirable.

As the photoresist, a positive photosensitive resin composition is used. As the positive photosensitive resin composition, a positive resist composition appropriate to use as a positive resist responding to radiation such as far-ultraviolet rays including ultraviolet rays (g-rays, h-rays, i-rays), an excimer laser or the like, and electron beam, an ion beam and x-rays can be used. Among the types of radiation, g-rays, h-rays and i-rays are preferable, and among these, i-rays are preferable.

Specifically, as the positive photosensitive resin composition, compositions containing a quinonediazide compound and an alkali soluble resin are preferable. A positive photosensitive resin composition containing a quinonediazide compound and an alkali soluble resin generates a carboxyl group due to a quinonediazide group decomposing by irradiation of light with a wavelength of 500 nm or less and is useful as a result in becoming alkali soluble from an alkali insoluble state. Because the resolving power of this positive photoresist is remarkably superior, it may be used in the manufacture of integrated circuits such as an IC or an LSI. Examples of the quinonediazide compound include naphthoquinone diazide compounds.

The thickness of the photoresist layer is preferably 0.1 μm to 3 μm, more preferably 0.2 μm to 2.5 μm, and still more preferably 0.3 μm to 2 μm. Moreover, coating of the photoresist layer can be suitably performed using the coating methods previously explained.

—Step (D-C)—

In the manufacturing method of a color filter using a dry etching method of the present invention, a predetermined pattern is worked by exposure and development of the photoresist layer formed in the above-described steps forming a resist pattern. Formation of the resist pattern in not particularly limited, and can be performed by appropriately optimizing the technology of photolithography known in the related art. By removing the photoresist layer formed by exposure and development in a desired pattern, a resist pattern in which regions of the photoresist layer for forming the colored pattern are removed is formed, and an etching mask used in a subsequent etching process is provided on the colored layer.

Exposure of the photoresist layer can be performed by exposing a positive or negative photosensitive resin composition with g-rays, h-rays, i-rays or the like, and preferably i-rays, via a predetermined mask pattern. After exposure, by performing a developing process with a developer, photoresist is removed matching regions for forming a color pattern.

Any developer dissolving the exposed portions of a positive resist and the uncured portions of a negative resist without influencing the colored layer including a colorant is usable, and various combinations of organic solvents or an alkaline aqueous solution can be used. An alkaline aqueous solution prepared by dissolving an alkaline compound at a concentration of 0.001 mass % to 10 mass %, and preferably 0.01 mass % to 1 mass % is suitable as the alkaline aqueous solution. Examples of the alkaline compound include sodium hydroxide, potassium hydroxide, sodium carbonate, sodium silicate, sodium metasilicate, aqueous ammonia, ethylamine, diethylamine, dimethyl ethanolamine, tetramethyl ammonium hydroxide, tetraethyl ammonium hydroxide, chlorine, pyrrole, piperidine, or 1,8-diazabicyclo-[5,4,0]-7-undecene. Moreover, in a case where an alkaline aqueous solution is used as a developer, a cleaning process is ordinarily performed using water after development.

—Step (D-D)—

In the manufacturing method of a color filter using a dry etching method of the present invention, a colored layer is dry etched using the resist pattern formed in the step (D-C) as an etching mask. Representative examples of the dry etching are the methods disclosed in the publications of JP1984-126506A (JP-S59-126506A) JP1984-46628A (JP-S59-46628A), JP1983-9108A (JP-S58-9108A), JP1983-2809A (JP-S58-2809A), JP1982-148706A (JP-S57-148706A), JP1986-41102A (JP-S61-41102A) or the like.

From the viewpoint of forming a more closely rectangular pattern cross-section or from the viewpoint of further reducing damage to the substrate, dry etching is preferably performed using the embodiments below.

An embodiment including, a first stage etching in which etching is performed using a mixed gas of fluorine-based gas and oxygen gas ($O_2$) up to regions (depth) in which the support is not exposed, a second stage etching using a mixed gas of nitrogen gas ($N_2$) and oxygen gas ($O_2$) in which etching is preferably performed up to the vicinity of regions (depth) in which the support is exposed after the first stage etching, and an over-etching performed after the support is exposed is preferable. Below, specific method of dry etching, along with first stage etching, second stage etching and over-etching will be described.

Dry etching is performed by the following method seeking etching conditions in advance.

(1) The etching rate (nm/min) in the first stage etching and the etching rate (nm/min) in the second stage etching are each calculated.

(2) The time period in which a desired thickness is etched in the first stage etching and the time period in which a desired thickness is etched in the second stage etching are each calculated.

(3) First stage etching is performed according to the etching time calculated in (2).

(4) Second stage etching is performed according to the etching time calculated in (2). Alternatively, the etching time may be determined using end point detection, and the second stage etching may be performed according to the determined etching time.

(5) The over-etching time is calculated with respect to the total times of (3) and (4), and over-etching is performed.

The mixed gas used in the first stage etching step preferably includes fluorine gas and oxygen gas ($O_2$), from the viewpoint of working an organic material which is the etching film to a rectangle. In addition, by setting the embodiment in which etching is performed up to regions in which the support is not exposed, the first stage etching step can avoid damage to the support.

In addition, for the second stage etching step and the over-etching step, after etching is performed up to regions in which the support is not exposed using a mixed gas of fluorine gas and oxygen gas in the first stage etching step, and from the viewpoint of avoiding damage to the support, it is preferable that the etching processes be performed using a mixed gas of nitrogen gas and oxygen gas.

It is important that the ratio of the etching amount in the first stage etching step and the etching amount in the second stage etching be determined so as not to damage the rectangularity due to the etching process in the first stage etching step. Moreover, the latter in the total etching amount (sum total of the etching amount in the first stage etching step and the etching amount in the second stage etching step) is preferably in a range of greater than 0% to 50% or less, and more preferably 10% to 20%. The term etching amount refers to the film thickness remaining of the etching film.

In addition, the etching preferably includes an over-etching process. The over-etching process is preferably performed by setting the over-etching rate. In addition, the over-etching rate is preferably calculated according to the etching process time first performed. The over-etching ratio can be arbitrarily set; however, the ratio is preferably 30% or less of the etching processing time in the etching step on the point of etching resistance of the photoresist and maintaining the rectangularity of the etching pattern, more preferably from 5% to 25%, and particularly preferably 10% to 15%.

The photoresist layer (that is, etching mask) remaining after dry etching is removed. Removal of the photoresist layer preferably includes a step of applying a peeling solution or solvent on the photoresist layer and setting the photoresist layer to a removable state and a step of removing the photoresist layer using a cleaning liquid.

Examples of a step of applying a peeling solution or solvent on the photoresist layer and setting the photoresist layer to a removable state include a step of applying at least a peeling solution or solvent on the photoresist layer and performing puddle development by retaining the liquid for a predetermined time. The time the peeling solution or solvent is retained is not particularly limited; however, several tens of seconds to several minutes is preferable.

In addition, examples of the step removing the photoresist layer using a cleaning liquid include a step of removing a photoresist layer by ejecting a cleaning liquid onto the photoresist layer from a spray or shower ejection nozzle. Pure water is preferably used as the cleaning liquid. In addition, a nozzle includes an ejection nozzle in which the support is entirely encompassed in the ejection range thereof, or an ejection nozzle which is a movable ejection nozzle and the support is entirely encompassed in the movable range thereof. In a case where the nozzle is a movable type, the photoresist layer can be more effectively removed by ejecting the cleaning liquid by moving two or more times from the central portion of the support to the end portion of the support in the step of removing the photoresist.

The peeling solution ordinarily contains an organic solvent; however, it may further contain an inorganic solvent. Examples of the organic solvent include 1) hydrocarbon-based compounds, 2) halogenated hydrocarbon-based compounds, 3) alcohol-based compounds, 4) ether or acetal-based compounds, 5) ketone or aldehyde-based compounds, 6) ester-based compounds, 7) polyhydric alcohol-based compounds, 8) carboxylic acid or acid anhydride-based compounds, 9) phenolic compounds, 10) nitrogen-containing compounds, 11) sulfur-containing compounds, or 12) fluorine-containing compounds. The peeling solution preferably contains a nitrogen-containing compound, and more preferably includes a non-cyclic nitrogen-containing compound and a cyclic nitrogen-containing compound.

The non-cyclic nitrogen-containing compound is preferably a non-cyclic nitrogen-containing compound having a hydroxyl group. Specifically, examples include monoisopropanolamine, diisopropanolamine, triisopropanolamine, N-ethyl ethanolamine, N,N-dibutyl ethanolamine, N-butyl ethanolamine, monoethanolamine, diethanolamine, and triethanolamine, preferably monoethanolamine, diethanolamine or triethanolamine, and more preferably monoethanolamine ($H_2NCH_2CH_2OH$). In addition, examples of the cyclic nitrogen-containing compounds include isoquinoline, imidazole, N-ethylmorpholine, ε-caprolactam, quinoline, 1,3-dimethyl-2-imidazolidinone, α-picoline, β-picoline, γ-picoline, 2-pipecoline, 3-pipecoline, 4-pipecoline, piperazine, piperidine, pyrazine, pyridine, pyrrolidine, N-methyl-2-pyrrolidone, N-phenylmorpholine, 2,4-lutidine, or 2,6-lutidine, preferably N-methyl-2-pyrrolidone or N-ethyl morpholine, and more preferably N-methyl-2-pyrrolidone (NMP).

The peeling solution preferably includes a non-cyclic nitrogen-containing compound and a cyclic nitrogen-containing compound; however, among these, including at least one type of cyclic nitrogen-containing compound selected from monoethanolamine, diethanolamine and triethanolamine, and at least one type of cyclic nitrogen-containing compound selected from N-methyl-2-pyrrolidone and N-ethyl morpholine is more preferable, and including monoethanolamine and N-methyl-2-pyrrolidine is still more preferable.

When removing using a peeling solution, the photoresist layer formed on the color pattern may be removed, and even in a case where deposits which are etching products are attached to the sidewall of the color pattern, the deposits may not be completely removed. The term "deposit" refers to etching products which attach to and are deposited on the sidewall of a colored layer.

As the peeling solution, those in which the content of the non-cyclic nitrogen-containing compound is 9 parts by mass or more to 11 parts by mass or less with respect to 100 parts by mass of the peeling solution, and the content of the cyclic nitrogen-containing compound is 65 parts by mass or more and 70 parts by mass or less with respect to 100 parts by mass of the peeling solution are desirable. In addition, the peeling solution is preferably a mixture of a non-cyclic nitrogen-containing compound and a cyclic nitrogen-containing compound diluted with pure water.

By repeatedly performing each of the above steps for each color in sequence according to desired hue numbers, a color filter can be manufactured in which a color pattern colored with a plurality of colors is formed.

<Manufacturing Method of Color Filter Using Photolithography Method>

A method of manufacturing a color filter using the colored curable composition of the present invention using a photolithography method (hereinafter, also referred to as a manufacturing method of a color filter using a photolithography method of the present invention) will be described.

The manufacturing method of a color filter using a photolithography method of the present invention has a step (A) of forming a colored layer by applying (preferably coating) the colored curable composition of the present invention on a substrate; and a step (B) of forming a color pattern by developing a colored layer formed in step (A) after being exposed to a pattern shape.

By undergoing these steps, a color pattern formed from each color of pixel (3 colors or 4 colors) can be formed, and a color filter can be obtained. In addition, in the manufacturing method of a color filter using a photolithography method of the present invention, an embodiment in which a step (C) irradiating the color pattern formed in step (B) with ultraviolet rays and a step (D) performing a heating process on the color pattern irradiated with ultraviolet rays in step (C) are further provided is particularly preferable.

According to such a method, there are a few difficulties in processing a color filter used in a liquid crystal display device or solid-state imaging element, and the color filter can be manufactured with high quality and at a low cost.

Hereinafter, the manufacturing method of a color filter using a photolithography method of the present invention will be described more specifically.

—Step (A)—

In the manufacturing method of a color filter using a photolithography method of the present invention, the previously explained colored curable composition of the present invention is applied directly on the substrate or with another layer interposed, a colored layer is formed, and thereafter, preliminary curing (pre-baking process) is performed as needed, and the colored layer is dried.

Examples of the substrate include alkali-free glass, sodium glass, Pyrex (registered trademark) glass, or quartz glass, and those on which a transparent conductive material is attached to these materials, which are used in a liquid crystal display device or the like, or a photoconversion element substrate, such as a silicon substrate, plastic substrate or complementary metal oxide film semiconductor (CMOS) substrate or the like, which are used in a solid-state imaging element. In addition, a black matrix separating each pixel may be formed or a transparent resin layer for promoting adhesion may be provided on these substrates. Also, an undercoat layer may be provided on the substrate as necessary in order to improve adhesion with the upper layer, to prevent diffusion of the substance, or to flatten the surface.

In addition, it is preferable that the plastic substrate have at least one of a gas barrier layer and a solvent-resistant layer on the surface thereof.

The colored curable composition of the present invention is applied either directly on the substrate or with another layer interposed. The method of application is preferably coating, and more preferably coating by a coating method such as spin coating, slit coating, flow casting coating, roll coating, bar coating, or ink jet.

In the application step, a pre-baking process is normally performed after application. Vacuum processing can be performed as needed before the pre-baking process. The conditions of the vacuum processing are ordinarily a vacuum degree of 0.1 torr to 1.0 torr, and preferably 0.2 torr to approximately 0.5 torr.

In addition, the pre-baking process can be performed using a hot plate, oven or the like in conditions of a temperature range of 50° C. to 140° C., preferably of 70° C. to approximately 110° C., for 10 seconds to 300 seconds. Moreover, a high frequency treatment may be used in combination with the pre-baking process. The high frequency treatment can also be used independently.

In addition, the thickness of the colored layer formed using the colored curable composition of the present invention is appropriately selected according to the object. In a color filter for use in a liquid crystal display device, a range of 0.2 μm to 5.0 μm is preferable, a range is 1.0 μm to 4.0 μm is more preferable, and a range of 1.5 μm to 3.5 μm is still more preferable. In addition, in a color filter for use in a solid-state imaging element, a range of 0.2 μm to 5.0 μm is preferable, a range of 0.3 μm to 2.5 μm is more preferable, and a range of 0.3 μm to 1.5 μm is still more preferable. Moreover, the thickness of the colored layer is the film thickness after the pre-baking process.

—Step (B)—

Next, in the manufacturing method of a color filter using a photolithography method of the present invention, exposure is performed, for example, via a photomask on the colored layer formed on a substrate as described previously. As the light or radiation applicable in the exposure, g-rays, h-rays, i-rays, j-rays, KrF light, and ArF light are preferable, and i-rays are particularly preferable. In a case where i-rays are used as irradiation light, irradiating at an exposure amount of 100 mJ/cm$^2$ to 10,000 mJ/cm$^2$ is preferable.

In addition, an ultra-high pressure, high pressure, medium pressure or low pressure mercury lamp, a chemical lamp, a carbon arc lamp, a xenon lamp, a metal halide lamp, various visible and ultraviolet laser light sources, a fluorescent lamp, a tungsten lamp, sunlight or the like can be used as other exposure lights.

(Exposure Step Using a Laser Light Source)

In an exposure method using a laser light source, an ultraviolet laser is used as a light source.

The irradiation light is preferably an ultraviolet laser with a wavelength in a range of 300 nm to 380 nm, more preferably an ultraviolet laser with a wavelength in a range of 300 nm to 360 nm which is preferable on the point of matching the photosensitive wavelength of the resist. Specifically, a comparatively inexpensive solid-state laser Nd:YAG laser with a third harmonic (355 nm) which has a particularly large output, an XeCl (308 nm), or XeF (353 nm) excimer laser can be suitably used.

The exposure amount of the exposure target (pattern) is in a range of 1 mJ/cm$^2$ to 100 mJ/cm$^2$, and more preferably in a range from 1 mJ/cm$^2$ to 50 mJ/cm$^2$. It is preferable on the point of productivity of pattern formation if the exposure amount is in this range.

The exposure apparatus is not particularly limited, and commercially available apparatuses, such as Callisto (manufactured by V Technology Co., Ltd.), EGIS (manufactured by V Technology Co., Ltd.) or DF2200G (manufactured by Dainippon Screen Mfg. Co., Ltd.) can be used. In addition, apparatuses other than those above can be suitably used.

When manufacturing a color filter for use in a liquid crystal display device, exposure using a proximity exposure device or a mirror projection exposure device in which h-rays or i-rays are mainly used is preferable. In addition, when manufacturing a color filter for use in a solid-state imaging element, it is preferable that i-rays be mainly used with a stepper exposure device.

In addition, the colored layer exposed as described above is heated using a hot plate or oven to 70° C. to 150° C. for 0.5 minutes to approximately 15 minutes before the development process.

In addition, exposure can be performed while nitrogen gas flows in a chamber in order to suppress oxidizing and decoloring of the colorant in the colored layer.

Next, development is performed with a developer on the colored layer after exposure. In so doing, a negative or positive color pattern (resist pattern) can be formed.

Any developer can be used if it dissolve the colored layer of the colored curable composition in the uncured portions, and meanwhile does not dissolve the cured portions. For example, a combination of various solvents, or an alkali aqueous solution can be used.

Examples of the solvent used in the developer include the previously described solvents which can be used when preparing the colored curable composition of the present invention.

Examples of the alkaline aqueous solution include alkaline aqueous solutions in which alkaline compounds, such as sodium hydroxide, potassium hydroxide, sodium carbonate, sodium hydrogen carbonate, sodium silicate, sodium metasilicate, aqueous ammonia, ethylamine, diethylamine, dimethyl ethanol amine, tetramethyl ammonium hydroxide, tetraethyl ammonium hydroxide, tetrapropyl ammonium hydroxide, tetrabutyl ammonium hydroxide, trimethylbenzyl ammonium hydroxide, choline, pyrrole, piperidine, 1,8-diazabicyclo-[5,4,0]-7-undecene are dissolved so as to have a concentration of 0.001 mass % to 10 mass %, and preferably 0.01 mass % to 1 mass %. In a case where the developer is an alkaline aqueous solution, the alkali concentration may be adjusted to preferably be pH 11 to 13, and more preferably pH 11.5 to 12.5.

In the alkaline aqueous solution, an aqueous solvent, such as methanol or ethanol, or a surfactant can be added in appropriate amounts.

The development temperature is ordinarily from 20° C. to 30° C., and the development time is 20 seconds to 90 seconds.

Development may be any of a dip method, shower method or a spray method, or a swing method, spin method, ultrasonic method or the like may be combined therewith. The developing surface may be wet with water or the like in advance before contact with the developer, which can prevent development unevenness. In addition, development can be performed by inclining the substrate.

Additionally, in the case of manufacturing a color filter for use in a solid-state imaging element, puddle development can also be used.

After development, a rinsing process cleaning and removing surplus developer is undergone, and a heating process (post-baking process) is performed after drying is performed in order that curing is complete.

The rinsing process is ordinarily performed using pure water, however, in order to save water, pure water may be used in the final cleaning and the initial cleaning may use used water, additionally, a method of cleaning by inclining the substrate and combined use of ultrasonic irradiation may be used.

After the rinsing process, a heating process is ordinarily performed at approximately 200° C. to 250° C. after draining the water and drying. This heating process (post-baking process) can be performed on the colored layer after development continuously or in batches using a heating means such as a hot plate or a convection oven (heat circulation dryer), or high frequency heater so as to meet the above conditions.

By repeatedly performing each of the above steps for each color in sequence according to desired hue numbers, a color filter can be manufactured in which a color pattern colored with a plurality of colors is formed.

—Step (C)—

In the manufacturing method of a color filter using a photolithography method of the present invention, in particular, by irradiating the color pattern (pixel) formed using the colored curable composition with ultraviolet rays, post-exposure can be performed.

—Step (D)—

It is preferable that a heating process be further performed on the color pattern on which post-exposure is performed using irradiation of ultraviolet rays as described above. By performing a heating process (a so-called post-baking process) on the color pattern formed, the color pattern can be further cured. This heating process can be performed using a hot plate, various heaters, an oven or the like.

The temperature during the heating process is preferably 100° C. to 300° C., and more preferably 150° C. to 250° C. In addition, the heating time is preferably 10 minutes to approximately 120 minutes.

The color pattern thus obtained configures the pixels in a color filter. In manufacturing a color filter having pixels in a plurality of hues, the above-described step (A), step (B) and, as needed, step (C) or step (D) may be repeated according to the desired number of colors.

Moreover, either or both of step (C) and step (D) may be performed each time formation, exposure, and development of a single color colored curable composition layer (for each color) is finished, and either or both of step (C) and step (D) may be performed collectively after formation, exposure, and development of all of the desired number of colors of colored curable composition layer is finished.

A color filter obtained by the manufacturing method of a color filter using a photolithography method of the present invention (color filter of the present invention) has high transmissivity as it uses the colored curable composition of the present invention.

Therefore, the color filter of the present invention can be used in liquid crystal display devices or organic EL display devices, or solid-state imaging elements such as a CCD image sensor or a CMOS image sensor and to camera systems in which these are used; among these, it is suitable to applications to solid-state imaging elements in which the color pattern is formed as a thin film with an extremely small size, and in which an excellent rectangular cross-sectional profile is demanded, and in particular, to applications to a high resolution CCD element or CMOS exceeding 1 million pixels.

Applications of the colored curable composition of the present invention are described centering mainly on applications to the formation of a color pattern of a color filter as above; however, the composition can be applied to the formation of a black matrix separating the color pattern (pixel) configuring the color filter.

A black matrix on the substrate uses a colored curable composition containing a processed pigment black pigment, such as carbon black, or titanium black, and can be formed by undergoing each step of coating, exposure and development, and thereafter performing post-baking as needed.

<Liquid Crystal Display Device>

The color filter of the present invention is particularly suitable as a color filter for use in a liquid crystal display device because of having color pixels with excellent hue and excellent light resistance. A liquid crystal display device provided with such a color filter can display high quality images with excellent image tone and excellent display characteristics.

In regard to the definition of display device and details of each display device, they are disclosed in, for example, "Electronic Display Devices (Sasaki Akio, Kogyo Chosakai Publishing Co., Ltd., published 1990)", "Display Devices (Ibuki Sumiaki, published by SANGYO-TOSHO Publishing Co., Ltd.)", and the like. Also, in regard to the liquid crystal display device, for example, it is disclosed in "Next Generation Liquid Crystal Display Technology (edited by Uchida Tatsuo Kogyo Chosakai Publishing Co., Ltd., published 1994)". There are no particular limitations to the liquid crystal display devices to which the present invention may be applied, for example, the liquid crystal display devices of various types disclosed in the above "Next Generation Liquid Crystal Display Technology" may be applied.

The color filter of the present invention, among these, is particularly effective with respect to a color TFT-type liquid crystal display device. In regard to the color TFT-type liquid crystal display device, for example, it is disclosed in "color TFT liquid crystal displays (Kyoritsu Shuppan Co., Ltd. published 1996)". Furthermore, the present invention may also be applied to a wide electric field drive type such as IPS or pixel division type such as MVA of liquid crystal display device in which the viewing angle is enlarged, or an STN, TN, VA, OCS, FFS, and R-OCB.

Also, the color filter in the present invention may also be used for a bright, high definition COA (Color Filter On Array) type. In a COA-type liquid crystal display device, the prescribed properties in regard to the color filter layer are, in addition to the normal prescribed properties described above, prescribed properties in regard to the inter-layer insulation film, in other words a low permittivity and a dissociation liquid resistance are sometimes required. In a color filter of the present invention, the (B) complex-forming compound in the present invention along with the (A) metal complex dyes is obtained by curing by containing the above ratio, and it is thought that decreases in the specific resistance of the liquid crystal material are dramatically prevented, and that obstruction of the alignment of the liquid crystal molecules, that is, decreases in the display characteristics can be resolved. Thereby, because the tone with good color purity and the like is excellent, a COA-type liquid crystal display device can be provided with high resolution and excellent long term durability. Furthermore, in order to satisfy the prescribed property of a low permittivity, a resin membrane may be provided on the color filter layer.

Furthermore, in the colored layer formed using a COA method, in order to electrically connect an ITO electrode arranged on the colored layer and a terminal of a driving substrate below the colored layer, a conductive path, such as a rectangular through hole with a length along one side of 1 μm to approximately 15 μm or a U-shaped concavity needs to be formed. The dimensions of the conductive path (that is, length along one side) are particularly preferably 5 μm or lower; however, due to using the present invention, a conductive path of 5 μm or lower can also be formed. These image displaying types are described, for example, in page 43 and the like of "Latest Trends in EL, PDP and LCD Display Technology and Markets (Toray Research Center Inc., published 2001)".

The liquid crystal display device of the present invention is configured from various members other than the color filter of the present invention, such as an electrode substrate, a polarization film, a phase difference film, a backlight, a spacer, or a viewing angle security film. The color filter of the present invention may be applied to a liquid crystal display device configured by these well-known members. These members are described in, for example, "Market Of '94 Liquid Crystal Display Periphery Members and Chemicals (Shima Kentaro, CMC Co., Ltd., published 1994)", "Present State and Future Prospects of 2003 Liquid Crystal Related Markets (Volume 2) (Omote Ryokichi, Fuji Research Institute, Co., Ltd., published 2003)".

The backlight is described in SID meeting Digest 1380 (2005) (A. Konno et. al), Displays Monthly, December 2005 issue, pp. 18 to 24 (Shima Yasuhiro) and pp. 25 to 30 of the same (Yagi Takaaki), and the like.

When using the color filter of the present invention in a liquid crystal display device, a high contrast may be expressed when combined with the well-known cold cathode tube three wavelength tube, further, by setting red, green, and blue LED light sources (RGB-LED) as the backlight, a liquid crystal display device may be provided in which the brightness is high, and, the color purity is high and the color reproduction is good.

<Solid-State Imaging Element>

The solid-state imaging element of the present invention is provided with a color filter of the present invention. The color filter of the present invention has high transmissivity, and a solid-state imaging element provided with this color filter is able to obtain excellent color reproducibility.

The configuration of the solid-state imaging element is not particularly limited if a configuration provided with a color filter of the present invention and functioning as a solid-state imaging element, and examples include the configurations below.

That is, on the substrate, the configuration has a plurality of photodiodes configuring the light receiving area of a CCD image sensor (solid-state imaging element) and a transfer electrode formed from polysilicon or the like, and a color filter of the present invention is provided, then a microlens is laminated thereon.

In addition, from the viewpoint of light-decoloring properties of the colorant, it is desirable that a camera system provided with a color filter of the present invention be provided with a camera lens or TR cut film provided with a dichroic coated cover glass or microlens, and that the optical properties of the materials thereof absorb a part of or all of the ultraviolet light of 400 nm or less. In addition, in order to suppress oxidation and discoloring of the members, the structure of the camera system is preferably a structure in which oxygen permeability to the color filter is lowered, and a part or all of the camera system is preferably sealed with nitrogen gas.

EXAMPLES

The present invention will be described in further detail using the examples below. The materials, usage amounts, ratios, processing content, processing order and the like of the examples shown below can be appropriately change as long as not departing from the gist of the present invention. Accordingly, the scope of present invention is not limited to the specific examples shown below. Moreover, unless otherwise mentioned, "parts" is based on mass.

Synthesis Example of Example Compound G-1

Synthesis was performed using the following schemes.

[Chem. 25]

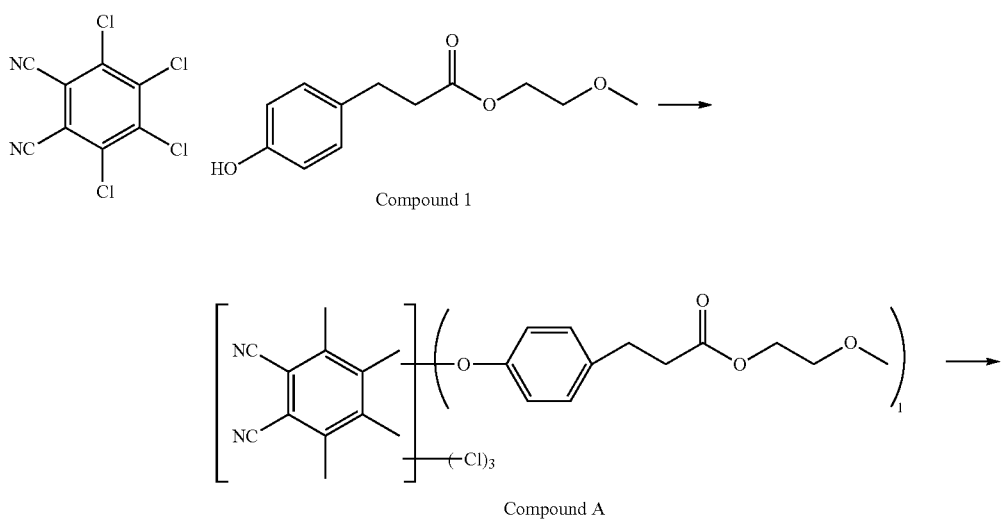

-continued
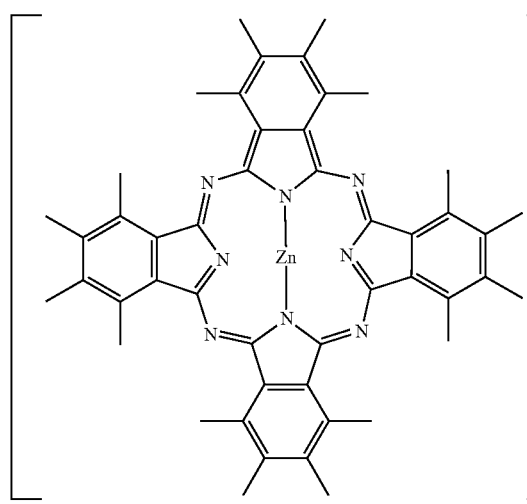
Compound B
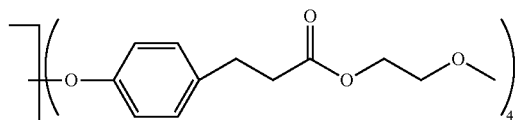
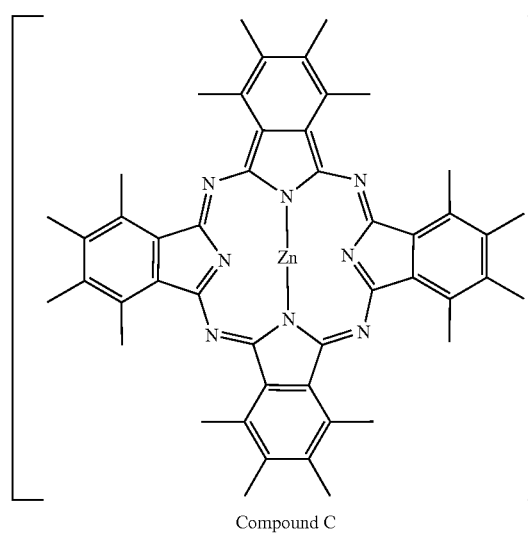
Compound C
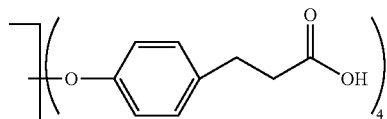
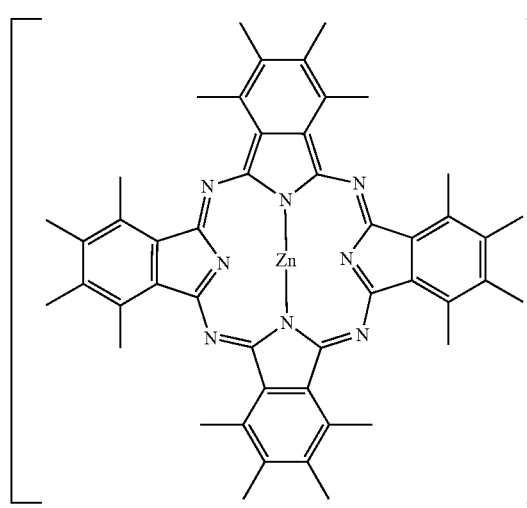
Compound D
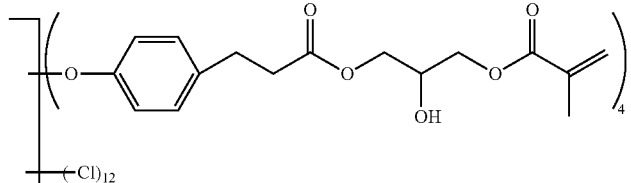

(Synthesis of Compound A)

Tetrachlorophthalonitrile (15.0 g, 56.4 mmol), the above-described compound 1 (12.65 g, 56.4 mmol) and 75.0 g of acetonitrile were introduced to a flask, and after stirring the mixed solution for 30 minutes until stabilized at an internal temperature of 40° C., potassium carbonate (8.58 g, 62.1 mmol) was introduced and reacted for approximately 3 hours. After cooling the obtained reaction solution, the suction filtering is performed. The solution obtained by suction filtration was concentrated under reduced pressure at 40° C. for 1 hour and the solvent was distilled off. Furthermore, the solution was vacuum dried overnight at 110° C., and approximately 23.0 g (89.9%) of compound A was obtained.

(Synthesis of Compound B)

Compound A (2.13 g, 4.7 mmol) and 2.35 ml of benzonitrile were introduced to a flask, and after stirring the mixed solution for approximately 1 hour under a nitrogen gas flow (10 ml/min) until stabilized at an internal temperature of 150° C., 0.43 g (1.3 mmol) of zinc iodide was introduced and reacted for approximately 60 hours. After cooling the obtained reaction solution, a crystallized solution was obtained by adding 30 ml of methanol and stirring at room temperature. The crystallized solution was decanted and the remaining residue was purified by silica gel column chromatography (chloroform/methanol). 20 ml of methanol was added to the obtained purified product and stirred under heating for one hour at 60° C. After cooling the obtained solution, the suction filtering is performed. 20 ml of methanol was added to the crystals obtained by suction filtering. The resultant was stirred under heating for one hour at 60° C. After cooling the obtained solution, the suction filtering is performed. The crystals obtained by suction filtering were air dried overnight at 40° C., and approximately 1.95 g (88.2%) of compound B was obtained.

(Synthesis of Compound C)

Compound B (1.75 g, 1.06 mmol), 20 ml of DMF, and 5 ml of a 1 M sodium hydrate aqueous solution were introduced to a flask, and the mixed solution was stirred for approximately 6 hours at an internal temperature of 60° C. After cooling the obtained solution, 10 ml of 1 M hydrochloric acid was added. 50 ml of methanol was added to this solution, the suction filtering is performed. The crystals obtained by suction filtering were air dried overnight at 40° C., and approximately 1.54 g (88.2%) of compound C was obtained.

(Synthesis of Example Compound G-1 (Compound D))

Compound C (1.5 g, 0.91 mmol), glycidyl methacrylate (1.03 g, 7.28 mmol), tetrabutylammonium bromide (0.23 g, 0.73 mmol), 0.02 g of p-methoxyphenol and propylene glycol monomethyl ether (9.0 ml) were introduced to a flask, and the mixed solution was stirred for approximately 8 hours at 100° C. 45 ml of methanol was added to this solution, the suction filtering is performed. The crystals obtained by suction filtering were air dried overnight at 40° C., and approximately 1.81 g (90%) of compound D was obtained.

NMR Data of Example Compound G-1 (Compound D)

$^1$H-NMR $(CD_3)_2SO$ δ 1.7-1.9 (m, 6H) 2.5-3.0 (br m, 16H) 3.2 (m, 8H) 3.4-3.6 (m, 6H) 3.8-4.3 (br m, 12H) 5.0 (m, 1H) 5.3 (m, 1H) 5.6 (s, 1H) 6.0 (s, 1H) 6.6-7.7 (m, 16H)

Synthesis Example of Example Compound G-2

Example compound G-2 was synthesized in the same manner as the synthesis example of example compound G-1 other than using copper chloride (II) instead of zinc iodide in the synthesis of compound B.

Synthesis Example of Example Compound G-3

Example compound G-3 was synthesized in the same manner as the synthesis example of example compound G-1 other than using tetrafluorophthalonitrile instead of tetrachlorophthalonitrile in the synthesis of compound A.

Synthesis Example of Example Compound G-4

Example compound G-4 was synthesized in the same manner as the synthesis example of example compound G-1 other than using tetrafluorophthalonitrile instead of tetrachlorophthalonitrile in the synthesis of compound A, and using copper chloride (II) instead of zinc iodide in the synthesis of compound B.

Synthesis Example of Example Compound G-5

Example compound G-5 was synthesized in the same manner as the synthesis example of example compound G-1 other than performing the reaction of compound 1:tetrachlorophthalonitrile=3:1 (mole ratio) in the synthesis of compound A.

Synthesis Example of Example Compound G-6

Example compound G-6 was synthesized in the same manner as the synthesis example of example compound G-1 other than using copper chloride (II) instead of zinc iodide in the synthesis of compound B, and performing the reaction of compound 1:tetrachlorophthalonitrile=3:1 (mole ratio) in the synthesis of compound A.

Synthesis Example of Example Compound G-7

Example compound G-7 was synthesized in the same manner as the synthesis example of example compound G-1 other than performing the reaction of 2.12 ml of 1M sodium hydroxide aqueous solution (mol ratio of 2 parts by weight with respect to compound B) in the synthesis of compound C.

Synthesis Example of Example Compound G-8

Example compound G-8 was synthesized in the same manner as the synthesis example of example compound G-1 other than using tetrafluorophthalonitrile instead of tetrachlorophthalonitrile in the synthesis of compound A, and performing the reaction of 1 M sodium hydroxide aqueous solution at a mol ratio of 2 parts by weight with respect to compound B in the synthesis of compound C.

Synthesis Example of Example Compound G-9

Example compound G-9 was synthesized in the same manner as the synthesis example of example compound G-1 other than using copper chloride (II) instead of zinc iodide in the synthesis of compound B, and performing the reaction of 1 M sodium hydroxide aqueous solution at a mol ratio of 2 parts by weight with respect to compound B in the synthesis of compound C.

Synthesis Example of Example Compound G-10

Example compound G-10 was synthesized in the same manner as the synthesis example of example compound G-1 other than using tetrafluorophthalonitrile instead of tetrachlorophthalonitrile in the synthesis of compound A, using copper chloride (II) instead of zinc iodide in the synthesis of compound B, and performing the reaction of 1 M sodium hydroxide aqueous solution at a mol ratio of 2 parts by weight with respect to compound B in the synthesis of compound C.

Synthesis Example of Example Compounds G-11 to G-14

With respect to the synthesis of compound C or the compound C obtained with the synthesis example of example compound G-7, the example compounds G-11 to G-14 (zinc phthalocyanine) were synthesized by condensing hydroxyethyl methacrylate to a compound having R-2 as a substituent and methacrylic acid amide to a compound having R-3 as a substituent.

Synthesis Example of Example Compounds G-15 to G-47

A substituted arylene compound corresponding to example compounds G-15 to G-47 in the synthesis of compound A is synthesized with reference to the patent literature information, and example compounds G-15 to G-47 (zinc phthalocyanine) are synthesized using the same methods as the above synthesis examples using this substituted arylene.

Synthesis Example of Example Compounds G-68

Example compound G-68 was obtained in the same manner as the synthesis example of example compound G-1 other than using the following compounds instead of the compound 1 in the synthesis of example compound G-1.

[Chem. 26]

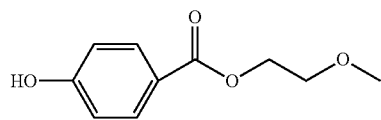

Example Compound G-68

NMR Data of Example Compound G-68

$^1$H-NMR (CD$_3$)$_2$SO δ 1.5-1.6 (m, 6H) 3.1-3.2 (m, 8H) 3.5-3.8 (m, 6H) 3.9-4.6 (br m, 12H) 4.9-6.2 (br m, 4H) 6.8-8.3 (m, 16H)

Synthesis Example of Example Compounds G-67, G-69 to G-71

Example compounds G-67, G-69 to G71 were synthesized using the same methods as the example compound G68.

The maximum absorption wavelength (λmax) in a chloroform solution of each synthesized example compound measured using a UV-visible spectrophotometer (UV-2400-PC, manufactured by Shimadzu Corporation) is shown in the table below.

TABLE 9

| Example Compound | Maximum Absorption Wavelength (λ max)(unit: nm) |
|---|---|
| G-1 | 701 |
| G-2 | 705 |
| G-3 | 710 |
| G-4 | 706 |
| G-5 | 700 |
| G-6 | 704 |
| G-7 | 700 |
| G-8 | 709 |
| G-9 | 704 |
| G-10 | 713 |
| G-11 | 701 |
| G-12 | 700 |
| G-13 | 701 |
| G-14 | 700 |
| G-15 | 701 |
| G-16 | 700 |
| G-17 | 701 |
| G-18 | 701 |
| G-19 | 711 |
| G-20 | 712 |
| G-21 | 711 |
| G-22 | 711 |
| G-23 | 711 |

[Chem. 27]

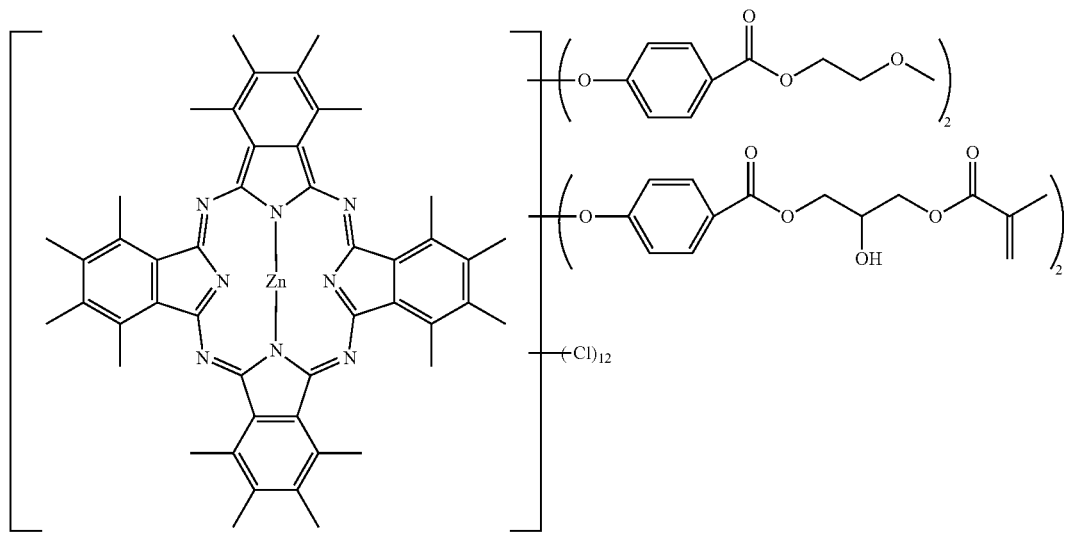

TABLE 10

| Example Compound | Maximum Absorption Wavelength (λ max)(unit: nm) |
| --- | --- |
| G-24 | 712 |
| G-25 | 711 |
| G-26 | 711 |
| G-27 | 697 |
| G-28 | 698 |
| G-29 | 697 |
| G-30 | 697 |
| G-31 | 697 |
| G-32 | 698 |
| G-33 | 697 |
| G-34 | 697 |
| G-35 | 705 |
| G-36 | 706 |
| G-37 | 705 |
| G-38 | 705 |
| G-39 | 705 |
| G-40 | 706 |
| G-41 | 705 |
| G-42 | 705 |
| G-43 | 695 |
| G-44 | 695 |
| G-45 | 695 |
| G-46 | 700 |
| G-47 | 700 |
| G-67 | 700 |
| G-68 | 700 |
| G-69 | 700 |
| G-70 | 700 |
| G-71 | 700 |

The evaluation below was performed for each of the obtained example compounds.

Example 1-1

Solubility 1.0 g of example compound G-1 was added to 9.0 g of propyleneglycol monomethyletheracetate (PGMEA) and stirred for 5 minutes at 25° C. The solution was visually inspected after stirring and evaluated according to the evaluation standards below. The results are shown in the table below.
(Evaluation Standards)
A: Completely dissolved.
B: Slight remainder present, without completely dissolving.
C: Remainder present, without completely dissolving.

Other Examples and Comparative Examples

The solubility of each example compound was evaluated in the same manner as example 1-1 other than the example compound G-1 in the above example 1-1 being substituted with the example compounds disclosed in the table below. The results are shown in the table below.

TABLE 11

| | Example Compound | Solubility |
| --- | --- | --- |
| Example 1-1 | G-1 | A |
| Example 1-2 | G-2 | A |
| Example 1-3 | G-3 | A |
| Example 1-4 | G-4 | A |
| Example 1-5 | G-5 | A |
| Example 1-6 | G-6 | A |
| Example 1-7 | G-7 | A |
| Example 1-8 | G-8 | A |
| Example 1-9 | G-9 | A |
| Example 1-10 | G-10 | A |
| Example 1-11 | G-11 | A |
| Example 1-12 | G-13 | A |
| Example 1-13 | G-15 | A |
| Example 1-14 | G-19 | A |
| Example 1-15 | G-20 | A |
| Example 1-16 | G-21 | A |
| Example 1-17 | G-22 | B |
| Example 1-18 | G-27 | A |
| Example 1-19 | G-28 | A |
| Example 1-20 | G-29 | A |
| Example 1-21 | G-30 | B |
| Example 1-22 | G-35 | A |
| Example 1-23 | G-36 | A |
| Example 1-24 | G-37 | A |
| Example 1-25 | G-38 | B |
| Example 1-26 | G-43 | A |
| Example 1-27 | G-44 | A |
| Example 1-28 | G-46 | A |
| Example 1-29 | G-47 | B |
| Example 1-30 | G-67 | A |
| Example 1-31 | G-68 | A |
| Example 1-32 | G-69 | B |
| Example 1-33 | G-70 | A |
| Example 1-34 | G-71 | A |
| Comparative Example 1-2 | A-2 | C |
| Comparative Example 1-3 | A-3 | C |

Compound A-1: Compound 54 disclosed in JP1993-2171567A (JP-H5-2171567A) Compound A-2: Compound 59 disclosed in JP1993-2171567A (JP-H5-2171567A) Compound A-3: Compound of Synthesis Example 1 of JP2010-102343A As is clear from the above table, it is understood that the solubility is excellent when using the compound of the present invention. On the other hand, it is understood that the solubility is inferior when using the compounds of the comparative examples.

Example 2-1

Preparation of Colored Curable Composition

The colored curable composition of example 2-1 was prepared by mixing components in the compositions below.
Example Compound G-1 . . . 10.5 parts
Curable Compound: EHPE 3150 (manufactured by Daicel Chemical Industries, molecular weight=2234). 4.485 parts
Solvent: propyleneglycol monomethyletheracetate (PGMEA). 85.0 parts
Surfactant: Megaface F-781 (manufactured by DIC Corporation). 0.015 parts
—Manufacturing of Color Layer Using Colored Curable Composition—
A color layer was manufactured by coating the obtained colored curable composition so as to having a film thickness of 0.5 μm on a 7.5 cm×7.5 cm glass substrate using a spin coater, heating at 200° C. for 5 minutes using a hotplate, and curing the coating film.
—Evaluation of Colored Layer Using Colored Curable Composition—
The following evaluation was performed on the colored layer obtained using the above.
<Transmissivity>
The absorption at 500 nm of the manufactured colored layer was measured with a UV-visible spectrophotometer (UV-2400PC, manufactured by Shimadzu Corporation).

Based on the obtained results, the transmissivity (500 nm) was calculated and evaluated according to the evaluation standard below. The results are shown in the table below.

(Evaluation Standards)
A: 99.0% or higher
B: 98.0% or higher to less than 99.0%
C: less than 98.0%

Example 2-2 to Examples 2-29, 2-41, 2-43, 2-45 to 2-47 and Comparative Examples

The transmissivity of each colored layer was evaluated in the same manner as example 2-1 other than the example compound G-1 in the above example 2-1 being substituted with the example compounds disclosed in the table below. The results are shown in the table below.

Example 2-30 to Examples 2-40, 2-42, and 2-44

The transmissivity of each colored layer was evaluated in the same manner as example 2-1 other than the example compound G-1 in the above example 2-1 being substituted with the example compounds disclosed in the table below, and a yellow colorant Y-1 being added. The results are shown in the table below.

Yellow Colorant Y-1

[Chem. 28]

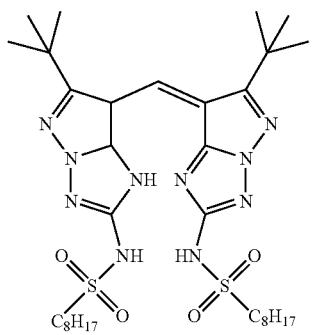

Y-1

The yellow colorant Y-1 was synthesized with the scheme below.

[Chem. 29]

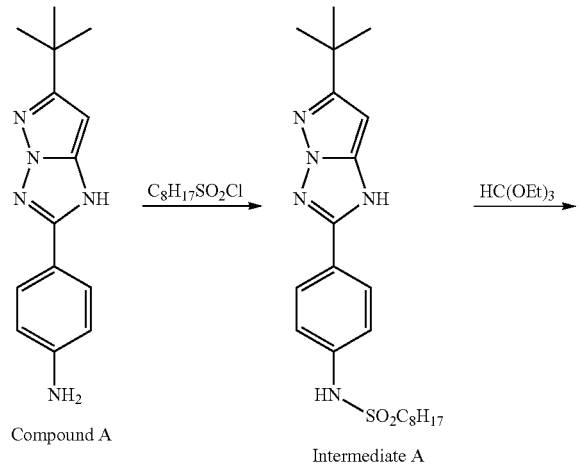

-continued

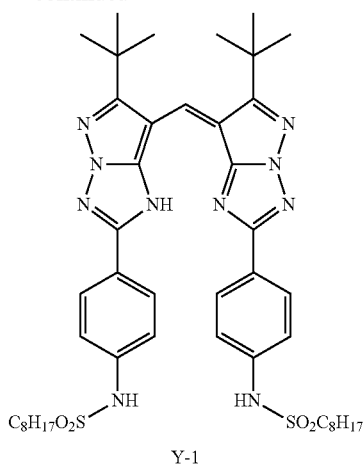

Y-1

(Synthesis of Intermediate A)

A mixed solution of 100 parts by weight of compound A (synthesized with the method disclosed in EP0571959A2) and 390 ml of pyridine was cooled to 5° C., and 87 parts by weight of octanesulfonyl chloride was added dropwise thereto at a reaction temperature of 25° C. or less. After stirring the reaction solution for 2 hours at room temperature, a 4N hydrochloric acid aqueous solution (2 L) was added, and filtered after stirring at room temperature. After washing the filtered crystals with 500 ml methanol, and 153 g (yield 91%) of intermediate A was obtained by drying.

$^1$H-NMR CDCl$_3$ δ 0.8 (t, 3H) 1.0-1.4 (m, 19), 1.6 (m, 2H) 3.2 (t, 2H) 5.6 (s, 1H) 7.3 (d, 2H) 7.9 (d, 2H) 10.2 (s, 1H) 12.9 (s, 1H)

(Synthesis of Y-1)

68 g of ethyl orthoformate was added to a suspended solution of intermediate A (110 g) and acetic acid (650 ml) at room temperature, and the reaction solution was stirred for 3 hours at 80° C. 1.1 L of methanol was added to the reaction solution, filtered after cooling, then 96 g (yield 88%) of Y-1 was obtained by washing with methanol.

$^1$H-NMR CDCl$_3$ δ 0.8 (t, 6 h) 1.2-2.0 (m, 41H) 3.3 (t, 4H) 7.3 (d, 4H), 7.6 (br, 2H) 7.8 (d, 4H) 8.4 (s, 1H)

TABLE 12

| | Example compound | Yellow Colorant | Transmissivity (500 nm) |
|---|---|---|---|
| Example 2-1 | G-1 | — | A |
| Example 2-2 | G-2 | — | A |
| Example 2-3 | G-3 | — | A |
| Example 2-4 | G-4 | — | A |
| Example 2-5 | G-5 | — | A |
| Example 2-6 | G-6 | — | A |
| Example 2-7 | G-7 | — | A |
| Example 2-8 | G-8 | — | A |
| Example 2-9 | G-9 | — | A |
| Example 2-10 | G-10 | — | A |
| Example 2-11 | G-11 | — | A |
| Example 2-12 | G-13 | — | A |
| Example 2-13 | G-15 | — | A |
| Example 2-14 | G-19 | — | A |
| Example 2-15 | G-20 | — | A |
| Example 2-16 | G-21 | — | A |
| Example 2-17 | G-22 | — | B |
| Example 2-18 | G-27 | — | A |

TABLE 12-continued

| Example | Yellow Colorant | Transmissivity (500 nm) |
|---|---|---|
| Example 2-19 | G-28 | — | A |
| Example 2-20 | G-29 | — | A |
| Example 2-21 | G-30 | — | B |
| Example 2-22 | G-35 | — | A |

TABLE 13

| Example | Yellow Colorant | Transmissivity (500 nm) |
|---|---|---|
| Example 2-23 | G-36 | — | A |
| Example 2-24 | G-37 | — | A |
| Example 2-25 | G-38 | — | B |
| Example 2-26 | G-43 | — | A |
| Example 2-27 | G-44 | — | A |
| Example 2-28 | G-46 | — | A |
| Example 2-29 | G-47 | — | B |
| Example 2-30 | G-1 | Y-1 | A |
| Example 2-31 | G-2 | Y-1 | A |
| Example 2-32 | G-3 | Y-1 | A |
| Example 2-33 | G-5 | Y-1 | A |
| Example 2-34 | G-7 | Y-1 | A |
| Example 2-35 | G-19 | Y-1 | A |
| Example 2-36 | G-27 | Y-1 | A |
| Example 2-37 | G-35 | Y-1 | A |
| Example 2-38 | G-43 | Y-1 | A |
| Example 2-39 | G-46 | Y-1 | A |
| Example 2-40 | G-47 | Y-1 | B |
| Example 2-41 | G-67 | — | A |
| Example 2-42 | G-67 | Y-1 | A |
| Example 2-43 | G-68 | — | A |
| Example 2-44 | G-68 | Y-1 | A |
| Example 2-45 | G-69 | — | A |
| Example 2-46 | G-70 | — | A |
| Example 2-47 | G-71 | — | A |
| Comparative Example 1-1 | A-1 | — | C |
| Comparative Example 1-2 | A-2 | — | C |

As is clear from the above tables, it is understood that a green colored layer with excellent transmissivity is obtained when the composition of the present invention is used. On the other hand, a green colored layer with inferior transmissivity is obtained when using the compositions of the comparative examples.

Example 3-1

Manufacturing of Color Filter Using Colored Curable Composition By Dry Etching Method <Coloring Layer Forming Step>

A colored layer was manufactured by coating the colored curable composition obtained with example 2-1 so as to having a film thickness of 0.5 μm on a 7.5 cm×7.5 cm glass substrate using a spin coater, heating at 200° C. for 5 minutes using a hotplate, and curing the coating film. The film thickness of the colored layer is 0.5 am.

<Resist Layer Forming Step>

Subsequently, a positive photoresist "FHi622BC" (manufactured by FUJIFILM Electronic Materials Co., Ltd.) was coated, subjected to a pre-baking process for 1 minute at 90° C., and a photoresist layer with a film thickness of 0.8 μm was formed.

<Resist Pattern Forming Step>

Subsequently, pattern exposure was performed on the photoresist layer at an exposure amount of 350 mJ/cm² using an i-ray stepper (manufactured by Canon Inc.), and next a heating process was performed for 1 minute at a photoresist layer temperature or the atmospheric temperature of 90° C. Thereafter, a developing process was performed for one minute with a developer "FHD-5" (manufactured by FUJIFILM Electronic Materials Co., Ltd.), further subjected to a post-baking process for 1 minute at 110° C., and a resist pattern was formed. The size of the resist pattern was formed at 1.25 μm on one side, in consideration of the etching conversion difference (shrinking of the pattern width due to etching).

<Color Pattern Forming Step>

Next, the glass substrate after resist pattern formation was adhered to an 8-inch silicon wafer, and subjected to the first stage etching treatment for 80 seconds with a dry etching apparatus (U-621, manufactured by Hitachi High-Technologies Corporation) under conditions of RF power: 800 W, antenna bias: 400 W, wafer bias: 200 W, chamber internal pressure: 4.0 Pa, substrate temperature: 50° C., and gas kind and flow rate of mixed gas: $CF_4$: 80 ml/min., $O_2$: 40 ml/min., Ar: 800 ml/min.

Subsequently, the second stage etching treatment (over-etching process) was performed for 28 seconds using the same etching chamber under conditions of RF power: 600 W, antenna bias: 100 W, wafer bias: 250 W, chamber internal pressure: 2.0 Pa, substrate temperature: 50° C., gas kind and flow rate of mixed gas: $N_2$: 500 ml/min., $O_2$: 50 ml/min., Ar: 500 ml/min ($N_2/O_2/Ar=10/1/10$).

After performing dry etching with the above conditions, the resist was removed by performing a peeling process for 120 seconds at 50° C. using a photoresist peeling solution "MS230C" (manufactured by FUJIFILM Electronic Materials Co., Ltd.), and a green color pattern was formed. Washing with pure water and spin drying were further performed, and thereafter a dehydration baking process was performed for 2 minutes at 100° C. Using the above, a color filter was obtained.

—Evaluation of Color Filter Using Colored Curable Composition—

The following evaluation was performed on the color filter obtained using the above. The results are shown in the table below.

<Pattern Formability>

The manufactured color filter was cut off with a glass cutter, the cross-section thereof was observed at a magnification of 15,000 times using a scanning electron microscope (S-4800, manufactured by Hitachi Corporation), and evaluation was performed according to the evaluation criteria below.

(Evaluation Standards)

A: A pattern with a line width of 1.2 μm was formed with good linearity.

B: Slight movement is confirmed in the pattern with a line width of 1.2 μm, but of an extent not problematic in actual use.

C: Linearity of pattern with a line width of 1.2 μm was noticeably bad.

<Defects>

Outside the formation region of the color pattern formed was observed at a magnification of 10,000 times using a scanning electron microscope (S-4800, manufactured by Hitachi Corporation), and evaluation was performed according to the evaluation criteria below.

(Evaluation Standards)

A: Absolutely no chipping confirmed in the edge of the color pattern.

B: Slight chipping confirmed in the edge of the color pattern, but of an extent not problematic in actual use.

C: Noticeable chipping confirmed in the edge of the color pattern.

Example 3-2 to Examples 3-29, 3-41, 3-43, 3-45 to 3-47 and Comparative Examples The pattern formability and defect characteristics of each color filter were evaluated in the same manner as example 2-1 other than example compound G-1 in the above example 2-1 being substituted with the example compounds disclosed in the table below. The results are shown in the table below.

Example 3-30 to Examples 3-40, 3-42, and 3-44

The pattern formability and defect characteristics of each color filter were evaluated in the same manner as example 2-1 other than example compound G-1 in the above example 3-1 being substituted with the example compounds disclosed in the table below, and the yellow colorant Y-1 being added. The results are shown in the table below.

TABLE 14

| | Example Compound | Yellow Colorant | Pattern Formability | Defect |
|---|---|---|---|---|
| Example 3-1 | G-1 | — | A | A |
| Example 3-2 | G-2 | — | A | A |
| Example 3-3 | G-3 | — | A | A |
| Example 3-4 | G-4 | — | A | A |
| Example 3-5 | G-5 | — | A | A |
| Example 3-6 | G-6 | — | A | A |
| Example 3-7 | G-7 | — | B | B |
| Example 3-8 | G-8 | — | A | A |
| Example 3-9 | G-9 | — | B | B |
| Example 3-10 | G-10 | — | B | B |
| Example 3-11 | G-11 | — | A | A |
| Example 3-12 | G-13 | — | A | A |
| Example 3-13 | G-15 | — | A | A |
| Example 3-14 | G-19 | — | A | A |
| Example 3-15 | G-20 | — | A | A |
| Example 3-16 | G-21 | — | A | A |
| Example 3-17 | G-22 | — | A | A |
| Example 3-18 | G-27 | — | A | A |
| Example 3-19 | G-28 | — | A | A |
| Example 3-20 | G-29 | — | A | A |
| Example 3-21 | G-30 | — | A | A |
| Example 3-22 | G-35 | — | A | A |

TABLE 15

| | Example Compound | Yellow Colorant | Pattern Formability | Defect |
|---|---|---|---|---|
| Example 3-23 | G-36 | — | A | A |
| Example 3-24 | G-37 | — | A | A |
| Example 3-25 | G-38 | — | B | B |
| Example 3-26 | G-43 | — | A | A |
| Example 3-27 | G-44 | — | A | A |
| Example 3-28 | G-46 | — | A | A |
| Example 3-29 | G-47 | — | B | B |
| Example 3-30 | G-1 | Y-1 | A | A |
| Example 3-31 | G-2 | Y-1 | A | A |
| Example 3-32 | G-3 | Y-1 | A | A |
| Example 3-33 | G-5 | Y-1 | A | A |
| Example 3-34 | G-7 | Y-1 | A | A |
| Example 3-35 | G-19 | Y-1 | A | A |
| Example 3-36 | G-27 | Y-1 | A | A |
| Example 3-37 | G-35 | Y-1 | A | A |
| Example 3-38 | G-43 | Y-1 | A | A |
| Example 3-39 | G-46 | Y-1 | A | A |
| Example 3-40 | G-47 | Y-1 | B | B |
| Example 3-41 | G-67 | — | A | A |
| Example 3-42 | G-67 | Y-1 | A | A |
| Example 3-43 | G-68 | — | A | A |
| Example 3-44 | G-68 | Y-1 | A | A |
| Example 3-45 | G-69 | — | A | A |
| Example 3-46 | G-70 | — | A | A |
| Example 3-47 | G-71 | — | A | A |
| Comparative Example 1-1 | A-1 | — | C | C |
| Comparative Example 1-2 | A-2 | — | C | C |
| Comparative Example 1-3 | A-3 | — | C | C |

As is clear from the above tables, it is understood that a pattern superior in pattern formability and defects is obtained when the composition of the present invention is used. On the other hand, a green color pattern with inferior pattern formability and defects is obtained when using the compositions of the comparative examples.

Example 4

Preparation of Colored Curable Composition

The colored curable composition of example 4 was prepared by mixing components in the compositions below.

Example Compound G-1 . . . 4.47 parts
Polymerizable Compound 1: Compound 1 below . . . 0.58 parts
Polymerizable Compound 2: Compound 2 below . . . 0.58 parts
Photopolymerization Initiator: Compound 3 below . . . 0.36 parts
Solvent: propyleneglycol monomethyletheracetate (PGMEA) . . . 43.99 parts
Surfactant: Megaface F-781 (manufactured by DIC Corporation) . . . 0.0125 parts
Polymerization-inhibitor: p-methoxyphenol 1.0% PGMEA solution . . . 0.0006 parts

[Chem. 30]

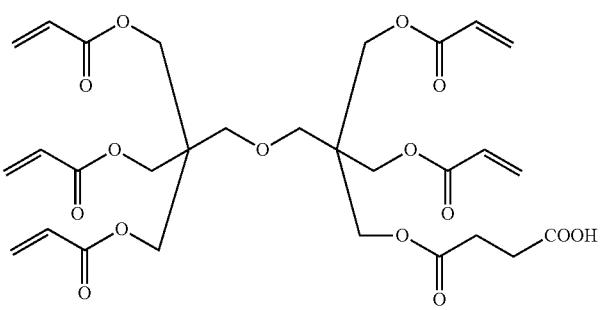

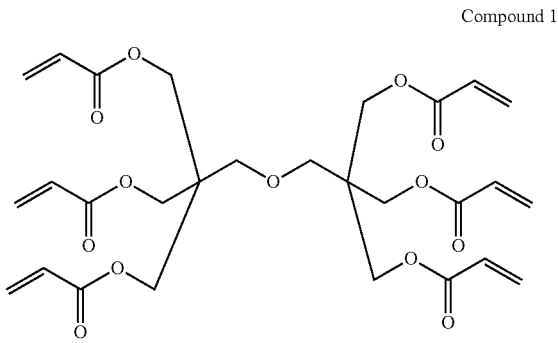

Compound 1

Compound of 7:3

[Chem. 31]

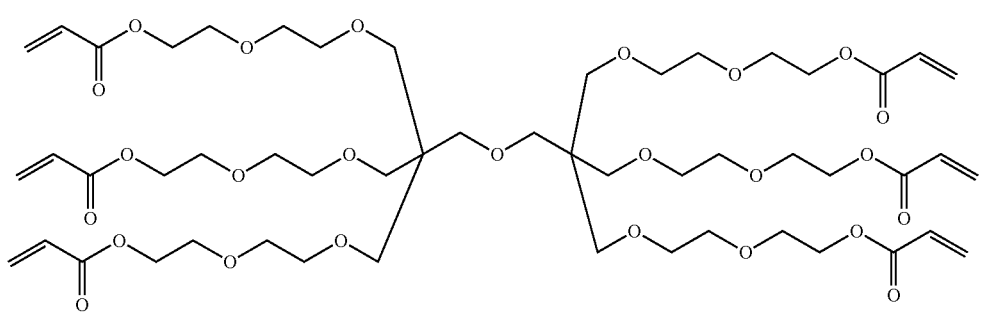

Compound 2

[Chem. 32]

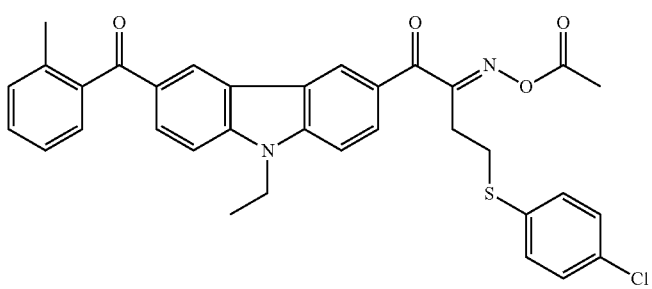

Compound 3

—Manufacturing of Color Filter Using Colored Curable Composition by Photolithography Method—

(Colored Layer Forming Step)

The above prepared colored curable composition was coated so that the coating film has a dried film thickness of 0.6 μm on the undercoat layer of a silicon wafer substrate with an attached undercoat layer so as to form a colored layer. Additionally, a pre-baking process was performed for 120 seconds at 100° C. using a hot plate.

(Color Pattern Forming Step)

Subsequently, the film was irradiated using an i-ray stepper exposure apparatus (FPA-3000i5+, manufactured by Canon Inc.) with light with a wavelength of 365 nm through an island pattern mask with a 1.4 μm square pattern, changing the exposure amount by 100 mJ/cm$^2$ in a range of 100 mJ/cm$^2$ to 2500 mJ/cm$^2$.

Thereafter, the silicon wafer substrate on which the coating film is formed was arranged on a horizontal rotary table of a spin-shower developing device (Model: DW-30, manufactured by Chemitronics Co., Ltd.), puddle developing was performed for 60 seconds at 23° C. using a CD-2000 (manufactured by FUJIFILM Electronic Materials Co., Ltd.), forming a green colored pattern on the silicon wafer substrate. The silicon wafer substrate on which the green color pattern is formed is fixed to the horizontal rotary table using a vacuum chuck method and subjected to a rinsing process by providing pure water in shower form from an ejection nozzle from above the rotation center thereof while the silicon wafer is rotated at a rotation speed of 50 rpm by a rotation device, and thereafter, spray drying was performed and a color filter was obtained.

When the color pattern formed using the photolithography method was evaluated for pattern formability and defect characteristics with the same evaluation as example 3-1, any of the satisfactory effects were obtained.

The colored curable composition of the present invention has superior transmissivity and solubility in a solvent, and further, has a few defects, superior pattern formability, and can be preferably used as a color filter, particularly a green color filter.

Furthermore, according to the present invention, a solid-state imaging element in which the coloring of a display image is vivid can be provided.

What is claimed is:

1. A colored curable composition comprising a compound represented by following general formula (1),

[Chem. 1]

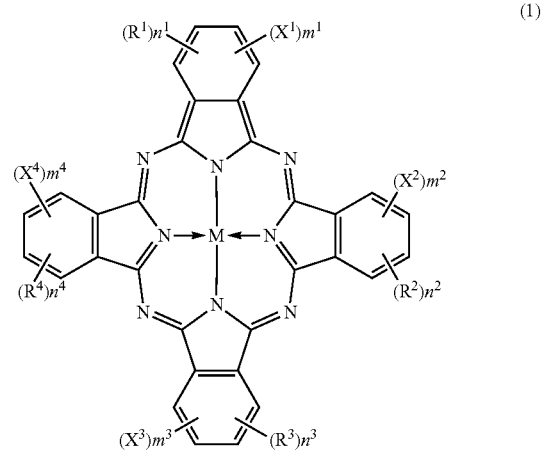

(1)

in general formula (1), $X^1$ to $X^4$ each represents a halogen atom, and M represents a metal atom, a metal oxide, a metal halide or a non-metal, $R^1$ to $R^4$ each represents a group represented by following general formula (2) or a substituent other than the group, and at least one of $R^1$ to $R^4$ is a group represented by following general formula (2), and $n^1$ to $n^4$ represent an integer of 0 to 4, and $m^1$ to $m^4$ represent an integer of 0 to 4, the sum total of $n^1$ to $n^4$ and the sum total of $m^1$ to $m^4$ are each 1 or higher;

[Chem. 2]

*-L$^1$-Ar-A     (2)

in general formula (2), $L^1$ represents a divalent linking group, Ar represents an arylene group, A represents a group represented by following general formula (3), and * represents a site bonding with a phthalocyanine ring; and

[Chem. 3]

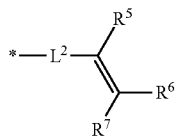
(3)

in general formula (3), $L^2$ represents a single bond or a divalent linking group, $R^5$ to $R^7$ each represents a hydrogen atom or a monovalent substituent, and * represents a site bonding with Ar in general formula (2).

2. The colored curable composition according to claim 1, wherein $X^1$ to $X^4$ in the general formula (1) are each a chlorine atom or a fluorine atom.

3. The colored curable composition according to claim 1, wherein Ar in the general formula (2) is a phenylene group or a naphthylene group.

4. The colored curable composition according to claim 1, wherein $L^1$ in the general formula (2) is —O— or —S—.

5. The colored curable composition according to claim 1,
wherein $X^1$ to $X^4$ in the general formula (1) is a chlorine atom;
Ar in the general formula (2) is a phenylene group;
and $L^1$ is —O—.

6. The colored curable composition according to claim 1, wherein the compound represented by the general formula (1) have 1 to 4 of the groups represented by general formula (2) in one molecule.

7. The colored curable composition according to claim 1, wherein the compound represented by the general formula (1) has a maximum absorption wavelength of 600 to 750 nm.

8. The colored curable composition according to claim 1, further comprising a curable compound.

9. The colored curable composition according to claim 1, further comprising a yellow colorant.

10. The colored curable composition according to claim 9, wherein the yellow colorant is an azo-based dye or a monomethine-based dye.

11. The colored curable composition according to claim 10, wherein the yellow colorant is a monomethine-based dye represented by following general formula (4),

[Chem. 4]

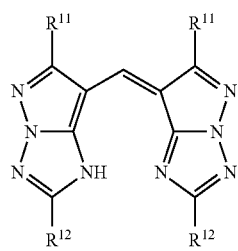
(4)

in general formula (4), $R^{11}$ each represents an alkyl group or a vinyl group, and $R^{12}$ each represents a substituent.

12. A color filter having a colored layer formed by using the colored curable composition according to claim 1.

13. A manufacturing method of a color filter comprising:
forming a colored layer by applying the colored curable composition according to claim 1 on a substrate;
further forming a photoresist layer on the formed colored layer;
forming a resist pattern by exposing and developing the photoresist layer to a pattern shape; and
forming a colored region by dry etching the colored layer with the resist pattern as an etching mask.

14. A manufacturing method of a color filter comprising:
forming a colored layer by applying the colored curable composition according to claim 1 on a substrate; and
forming a colored region by exposing and developing the formed colored layer to a pattern shape.

15. A solid-state imaging element comprising a color filter according to claim 12.

16. A liquid crystal display device comprising a color filter according to claim 12.

17. An organic EL display device comprising a color filter according to claim 12.

18. A coloring matter represented by following general formula (1),

[Chem. 5]

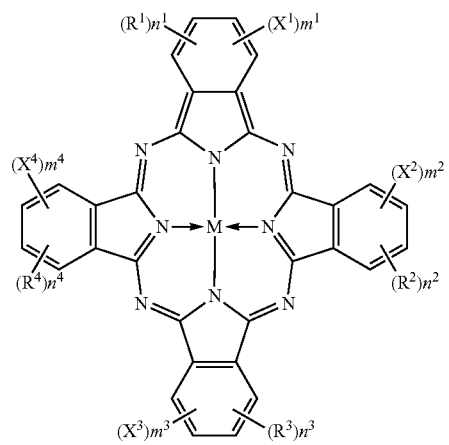
(1)

in general formula (1), $X^1$ to $X^4$ each represents a halogen atom, and M represents a metal atom, a metal oxide, a metal halide or a non-metal, $R^1$ to $R^4$ each represents a group represented by following general formula (2) or a substituent other than the group, and at least one of $R^1$ to $R^4$ is a group represented by following general formula (2), and $n^1$ to $n^4$ represent an integer of 0 to 4, and $m^1$ to $m^4$ represent an integer of 0 to 4, the sum total of $n^1$ to $n^4$, and the sum total of $m^1$ to $m^4$ are 1 or higher, respectively;

[Chem. 6]

*-L$^1$-Ar-A  (2)

in general formula (2), $L^1$ represents a divalent linking group, Ar represents an arylene group, A represents a group represented by following general formula (3), and * represents a site bonding with a phthalocyanine ring; and

[Chem. 7]

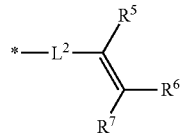
(3)

in general formula (3), $L^2$ represents a single bond or a divalent linking group, $R^5$ to $R^7$ each represents a hydrogen atom or a monovalent substituent, and * represents a site bonding with Ar in general formula (2).

* * * * *